United States Patent
Jurasek

(10) Patent No.: US 8,837,211 B2
(45) Date of Patent: *Sep. 16, 2014

(54) ROBUST INITIALIZATION WITH PHASE CHANGE MEMORY CELLS IN BOTH CONFIGURATION AND ARRAY

(71) Applicant: Being Advanced Memory Corporation, Essex Junction, VT (US)

(72) Inventor: Ryan Jurasek, Burlington, VT (US)

(*) Notice: Subject to any disclaimer, the term of this patent is extended or adjusted under 35 U.S.C. 154(b) by 0 days.

This patent is subject to a terminal disclaimer.

(21) Appl. No.: 13/869,082

(22) Filed: Apr. 24, 2013

(65) Prior Publication Data

US 2013/0336049 A1 Dec. 19, 2013

Related U.S. Application Data

(60) Provisional application No. 61/637,533, filed on Apr. 24, 2012, provisional application No. 61/784,480, filed on Mar. 14, 2013.

(51) Int. Cl.
*G11C 11/00* (2006.01)
*G11C 13/00* (2006.01)

(52) U.S. Cl.
CPC ........ *G11C 13/0004* (2013.01); *G11C 13/0061* (2013.01); *G11C 2213/79* (2013.01); *G11C 13/004* (2013.01)
USPC ............................ 365/163; 365/148; 365/200

(58) Field of Classification Search
CPC ........... G11C 13/0004; G11C 13/0069; G11C 29/808
USPC .................................. 365/163, 148, 200, 201
See application file for complete search history.

(56) References Cited

U.S. PATENT DOCUMENTS

| | | | |
|---|---|---|---|
| 7,859,883 B2 * | 12/2010 | Shuy et al. ................ | 365/148 |
| 2005/0219920 A1 | 10/2005 | Sugawara | |
| 2007/0230263 A1 | 10/2007 | Sakakibara | |
| 2010/0142269 A1 | 6/2010 | Kikuchi et al. | |
| 2012/0044755 A1 | 2/2012 | Kim et al. | |

FOREIGN PATENT DOCUMENTS

| | | |
|---|---|---|
| CN | 102270505 A | 12/2011 |
| CN | 102332302 A | 1/2012 |
| CN | 102594315 A | 7/2012 |
| CN | 102637453 A | 8/2012 |
| CN | 103165179 A | 6/2013 |
| CN | 103165181 A | 6/2013 |
| KR | 20100115970 A | 10/2010 |
| KR | 1020100115970 | 10/2010 |

OTHER PUBLICATIONS

International Search Report from KIPO for PCT/US13/37889.
Written Opinion from KIPO for PCT/US13/37889.
International Search Report from KIPO for PCT/US13/37889, mailed on Oct. 25, 2013.
Written Opinion from KIPO for PCT/US13/37889, miled on Oct. 25, 2013.

* cited by examiner

*Primary Examiner* — Huan Hoang
(74) *Attorney, Agent, or Firm* — Gwendolyn S. S. Groover; Robert O. Groover, III; Seth A. Horwitz

(57) ABSTRACT

The present application discloses phase-change memory architectures and methods, in which an additional test is performed, after the normal power-valid signal, to assure that the phase-change memory components which are used for storing configuration data are able to operate correctly. Surprisingly, the inventor has discovered that this additional test is highly desirable when using phase-change memory for configuration data.

14 Claims, 22 Drawing Sheets

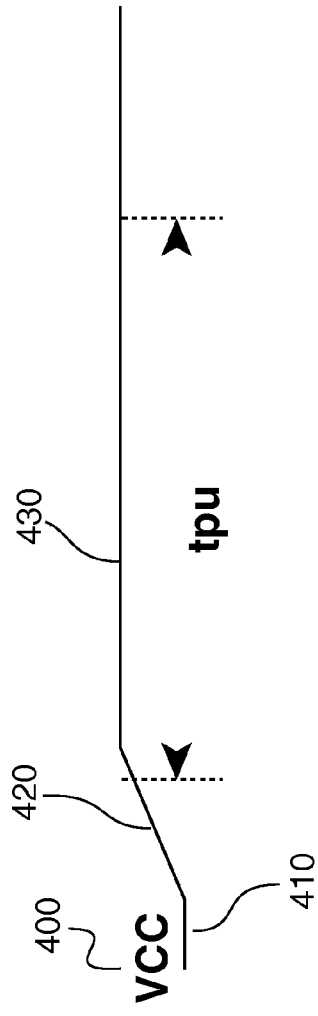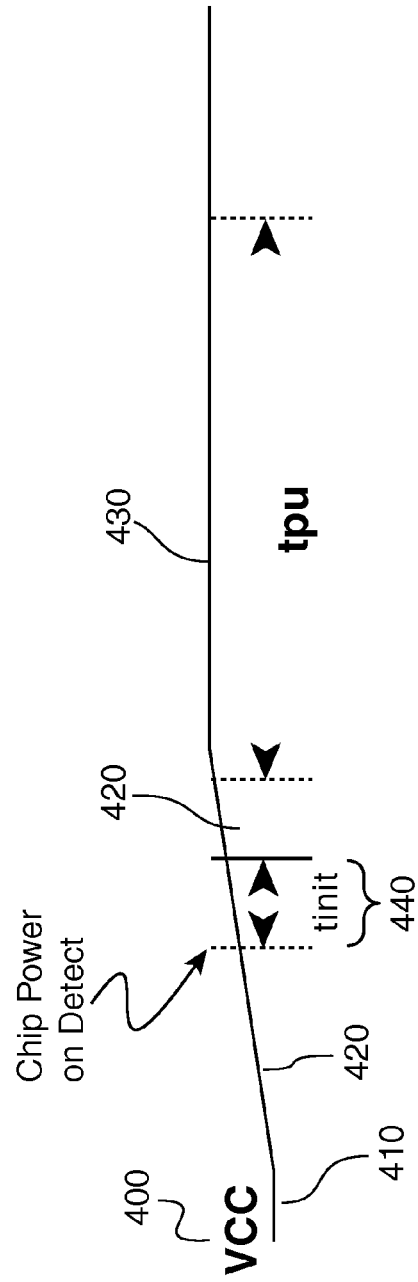

ROBUST INITIALIZATION WITH PHASE CHANGE MEMORY CELLS IN BOTH CONFIGURATION AND ARRAY

CROSS-REFERENCE

Priority is claimed from U.S. Provisional Pat. No. 61/637,533 filed Apr. 24, 2012, which is hereby incorporated by reference.

Priority is claimed from U.S. Provisional Pat. No. 61/784,480 filed Mar. 14, 2013, which is hereby incorporated by reference.

BACKGROUND

The present application relates to systems, devices and methods for startup operations involving phase change memory units.

Note that the points discussed below may reflect the hindsight gained from the disclosed inventions, and are not necessarily admitted to be prior art.

Phase change memory ("PCM") is a relatively new nonvolatile memory technology, which is very different from any other kind of nonvolatile memory. First, the fundamental principles of operation, at the smallest scale, are different: no other kind of solid-state memory uses a reversible PHYSICAL change to store data. Second, in order to achieve that permanent physical change, an array of PCM cells has to allow read, set, and reset operations which are all very different from each other. The electrical requirements of the read, set, and reset operations make the peripheral circuit operations of a PCM very different from those of other nonvolatile memories. Obviously some functions, such address decoding and bus interface, can be the same; but the closest-in parts of the periphery, which perform set, reset, and read operations on an array or subarray, must satisfy some unique requirements.

The physical state of a PCM cell's memory material is detected as resistance. For each selected cell, its bitline is set to a known voltage, and the cell's access transistor is turned on (by the appropriate wordline). If the cell is in its low-resistance state, it will sink a significant current from the bit line; if it is not, it will not.

Set and Reset operations are more complicated. Both involve heat. As discussed below, a "set" operation induces the memory material to recrystallize into its low-resistance (polycrystalline) state; a "reset" operation anneals the memory material into its high-resistance (amorphous) state.

Write operations (Set and Reset) normally have more time budget than read operations. In read mode a commercial PCM memory should be competitive with the access speed (and latency if possible) of a standard DRAM. If this degree of read speed can be achieved, PCM becomes very attractive for many applications.

The phase change material is typically a chalcogenide glass, using amorphous and crystalline (or polycrystalline) phase states to represent bit states.

A complete PCM cell can include, for example: a top electrode (connected to the bit line), a phase change material (e.g. a chalcogenide glass), a conductive pillar which reaches down from the bottom of the phase change material, an access transistor (gated by a word line), and a bottom connection to ground. The phase change material can extend over multiple cells (or over the whole array), but the access transistors are laterally isolated from each other by a dielectric.

FIG. 2A shows an example of a PCM element 2010. A top electrode 2020 overlies a phase change material 2030, e.g. a chalcogenide glass. Note that material 2030 also includes a mushroom-shaped annealed zone (portion) 2070 within it. (The annealed zone 2070 may or may not be present, depending on what data has been stored in this particular location.) The annealed zone 2070, if present, has a much higher resistivity than the other (crystalline or polycrystalline) parts of the material 2030.

A conductive pillar 2050 connects the material 2030 to a bottom electrode 2040. In this example, no selection device is shown; in practice, an access transistor would normally be connected in series with the phase change material. The pillar 2050 is embedded in an insulator layer 2060.

When voltage is applied between the top 2020 and bottom 2040 electrodes, the voltage drop will appear across the high-resistivity zone 2070 (if present). If sufficient voltage is applied, breakdown will occur across the high-resistivity zone. In this state the material will become very conductive, with large populations of mobile carriers. The material will therefore pass current, and current crowding can occur near the top of the pillar 2050. The voltage which initiates this conduction is referred to as the "snapback" voltage, and FIG. 2C shows why.

FIG. 2C shows an example of instantaneous I-V curves for a device like that of FIG. 2A, in two different states. Three zones of operation are marked.

In the zone 2200 marked "READ," the device will act either as a resistor or as an open (perhaps with some leakage). A small applied voltage will result in a state-dependent difference in current, which can be detected.

However, the curve with open circles, corresponding to the amorphous state of the device, shows some more complex behaviors. The two curves show behaviors under conditions of higher voltage and higher current.

If the voltage reaches the threshold voltage $V_{th}$, current increases dramatically without any increase in voltage. (This occurs when breakdown occurs, so the phase-change material suddenly has a large population of mobile carriers.) Further increases in applied voltage above $V_{th}$ result in further increases in current; note that this upper branch of the curve with hollow circles shows a lower resistance than the curve with solid squares.

If the applied voltage is stepped up to reach the zone 2150, the behavior of the cell is now independent of its previous state.

When relatively large currents are applied, localized heating will occur at the top of the pillar 2050, due to the relatively high current density. Current densities with typical dimensions can be in the range of tens of millions of Amperes per square cm. This is enough to produce significant localized heating within the phase-change material.

This localized heating is used to change the state of the phase-change material, as shown in FIG. 2B. If maximum current is applied in a very brief pulse 2100 and then abruptly stopped, the material will tend to quench into an amorphous high-resistivity condition; if the phase-change material is cooled more gradually and/or not heated as high as zone 2150, the material can recrystallize into a low-resistivity condition. Conversion to the high-resistance state is normally referred to as "Reset", and conversion to the low-resistance state is normally referred to as "Set" (operation 2080). Note that, in this example, the Set pulse has a tail where current is reduced fairly gradually, but the Reset pulse does not. The duration of the Set pulse is also much longer than that of the Reset pulse, e.g. tens of microseconds versus hundreds of nanoseconds.

FIG. 2D shows an example of temperature versus resistivity for various PCM materials. It can be seen that each curve has a notable resistivity drop 2210 at some particular temperature. These resistivity drops correspond to phase change to a crystalline (or polysilicon) state. If the material is cooled gradually, it remains in the low resistivity state after cooling.

In a single-bit PCM, as described above, only two phases are distinguished: either the cell does or does not have a significant high-resistivity "mushroom cap" 2070. However, it is also possible to distinguish between different states of the mushroom cap 2070, and thereby store more than one bit per cell.

FIG. 2E shows an equivalent circuit for an "upside down" PCM cell 2010. In this example the pass transistor 2240 is gated by Wordline 2230, and is connected between the phase-change material 2250 and the bitline 2220. (Instead, it is somewhat preferable to connect this transistor between ground and the phase-change material.

FIG. 2F shows another example of a PCM cell 2010. A bitline 2220 is connected to the top electrode 2020 of the phase-change material 2250, and transistor 2240 which is connected to the bottom electrode 2030 of the PCM element. (The wordline 2230 which gates the vertical transistor 2240 is not shown in this drawing.) Lines 2232, which are shown as separate (and would be in a diode array), may instead be a continuous sheet, and provide the ground connection.

FIG. 2G shows an example of resistance (R) over time (t) for a single PCM cell following a single PCM write event at time t=0. The resistance curve 2400 for a cell which has been reset (i.e. which is in its high-resistance state) may rise at first, but then drifts significantly lower. The resistance curve 2410 for a cell in the Set state is much flatter. The sense margin 2420, i.e., the difference between set and reset resistances, also decreases over time. Larger sense margins generally result in more reliable reads, and a sense margin which is too small may not permit reliable reading at all. 2G represents the approximate behavior of one known PCM material; other PCM material compositions may behave differently. For example, other PCM material compositions may display variation of the set resistance over time.

The downwards drift of reset resistance may be due to, for example, shrinking size of the amorphous zone of the phase-change material, due to crystal growth; and, in some cells, spontaneous nucleation steepening the drift curve (possibly only slightly) due to introducing further conductive elements into the mushroom-shaped programmable region.

FIG. 2H shows an example of a processing system 2300. Typically, a processing system 2300 will incorporate at least some of interconnected power supplies 2310, processor units 2320 performing processing functions, memory units 2330 supplying stored data and instructions, and I/O units 2340 controlling communications internally and with external devices 2350.

FIG. 2I shows an example of a PCM single ended sensing memory. Two different PCM cells 2400 on different ends of a sense amplifier can be selected separately. Selected elements 2410 are separately sensed by a single-ended sense amplifier 2420.

FIG. 2J shows an example of a known PCM single ended sense amplifier 2500. Generally, in a single ended sense amplifier, a cell read output conducted by a selected bitline BLB is compared against a reference current to provide a digital output OUT. When the PRECHARGE signal turns on transistor 2530, voltage V04 (e.g., 400 mV) precharges the bitline BLB. After precharge ends, the READ signal turns on transistor 2550. Transistor 2550 is connected, through source follower 2560 and load 2580, to provide a voltage which comparator 2600 compares to Voltage_REF, to thereby generate the digital output OUT.

A variety of nonvolatile memory technologies have been proposed over recent decades, and many of them have required some engineering to provide reference values for sensing. However, the requirements and constraints of phase-change memory are fundamentally different from those of any other kind of nonvolatile memory. Many memory technologies (such as EEPROM, EPROM, MNOS, and flash) test the threshold voltage of the transistor in a selected cell, so referencing must allow for the transistor's behavior. By contrast, phase-change memory simply senses the resistance of the selected cell. This avoids the complexities of providing a reference which will distinguish two (or more) possibilities for an active device's state, but does require detecting a resistance value, and tracking external variations (e.g. temperature and supply voltage) which may affect the instantaneous value of that resistance.

SUMMARY

The present application discloses phase-change memory architectures and methods, in which an additional test is performed, after the normal power-valid signal, to assure that the phase-change memory components which are used for storing configuration data are able to operate correctly. Surprisingly, the inventor has discovered that this additional test is highly desirable when using phase-change memory for configuration data.

The present application also discloses surprising new approaches to systems in which PCM is used, as well as methods for operating such systems. By adding an additional test to assure sanity of PCM storage, configuration data can be safely kept in PCM. At power-up, test reads of PCM memory elements with known states are used to determine whether instantaneous supply voltage levels permit PCM to be reliably read. This extra level of safeguard is surprising, but does permit phase-change memory to be used for storing memory configuration data and system configuration data.

BRIEF DESCRIPTION OF THE DRAWINGS

The disclosed inventions will be described with reference to the accompanying drawings, which show important sample embodiments and which are incorporated in the specification hereof by reference, wherein:

FIG. 4a shows an example of a voltage-time curve during power-up.

FIG. 4b shows an example of a voltage-time curve during power-up.

DETAILED DESCRIPTION OF SAMPLE EMBODIMENTS

Figure 1:
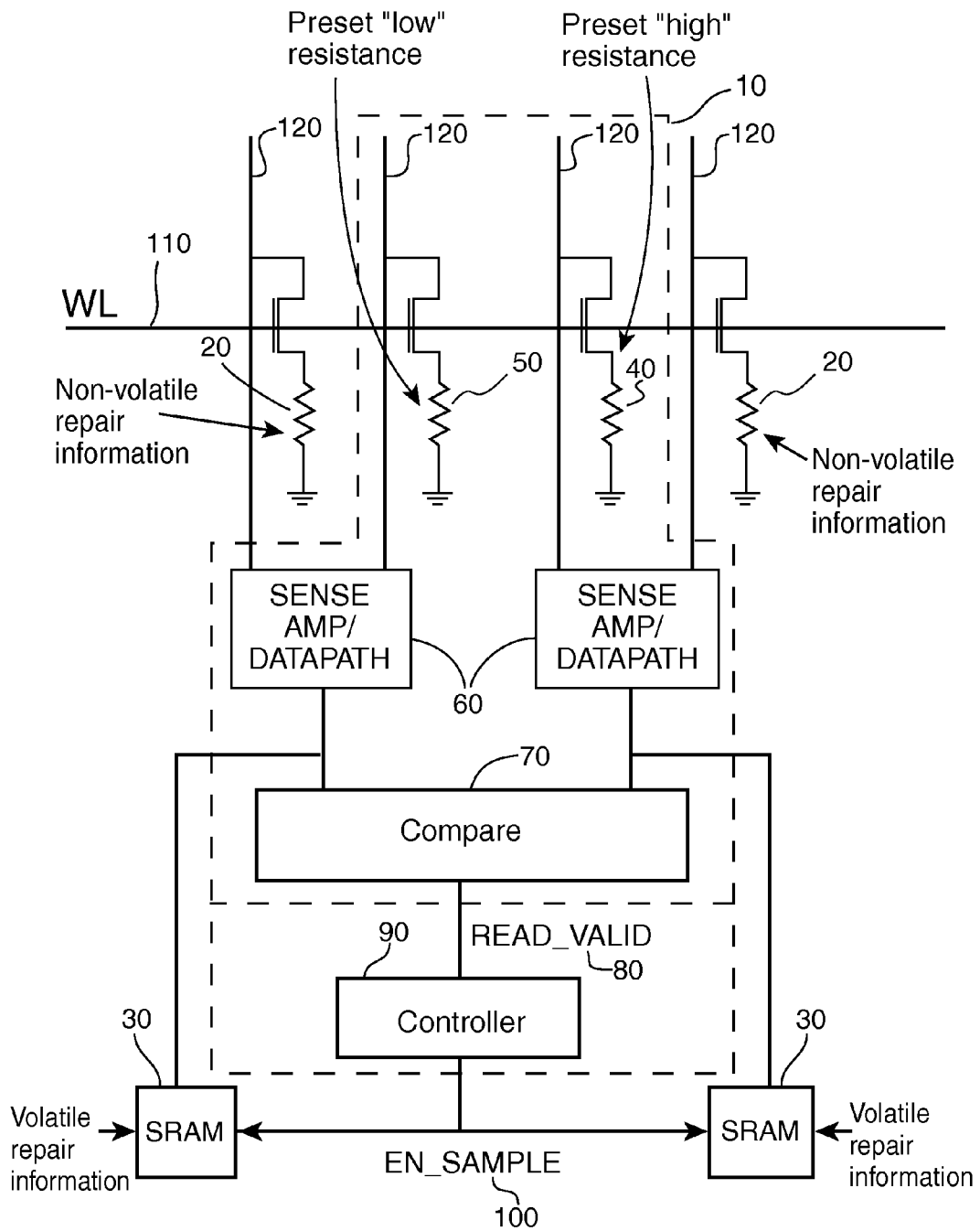
FIG. 1 schematically shows a PCM memory system.
Figure 2A:
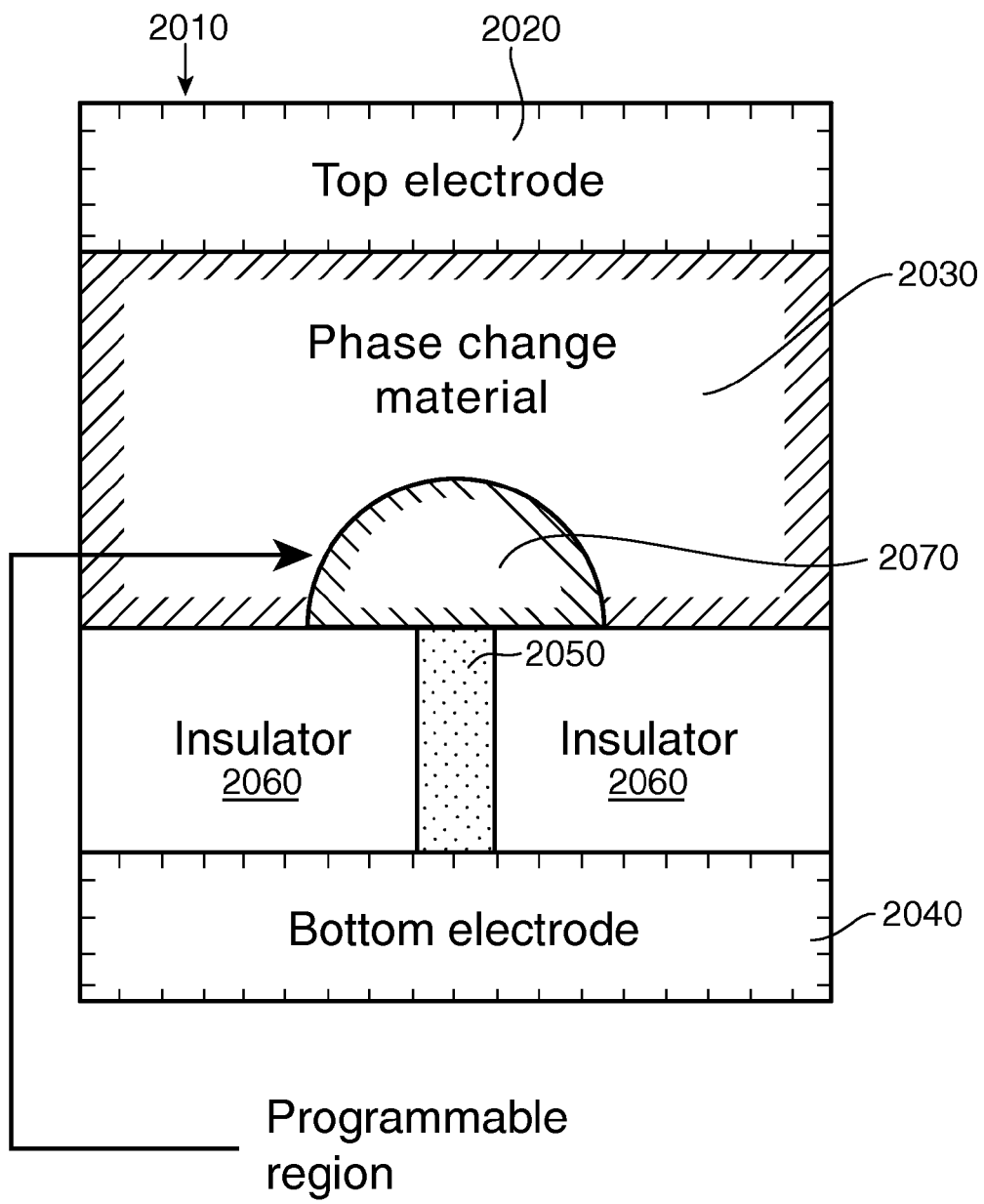
FIG. 2A shows an example of a PCM element.
Figure 2B:
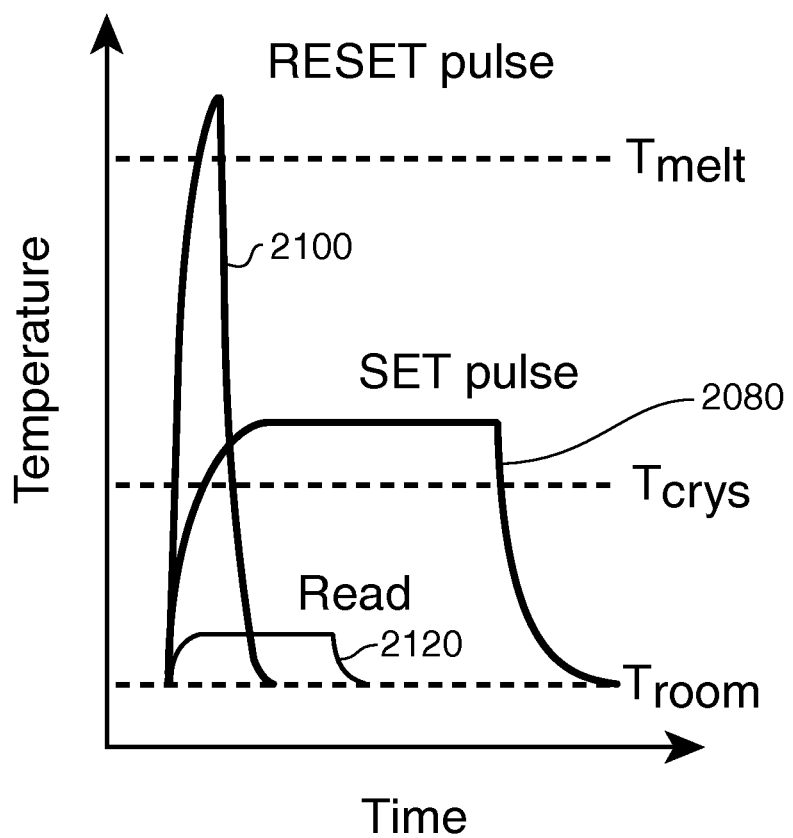
FIG. 2B shows an example of PCM bit line signals.
Figure 2C:
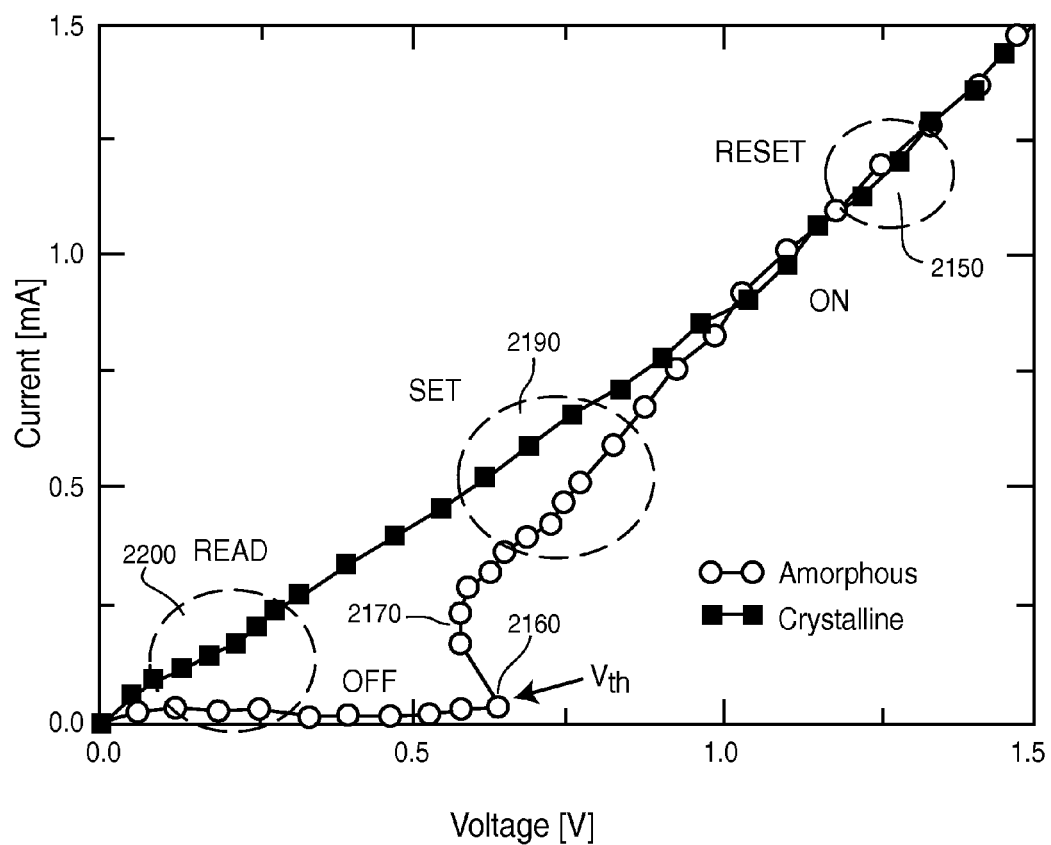
FIG. 2C shows an example of voltage versus current in a PCM material.
Figure 2D:
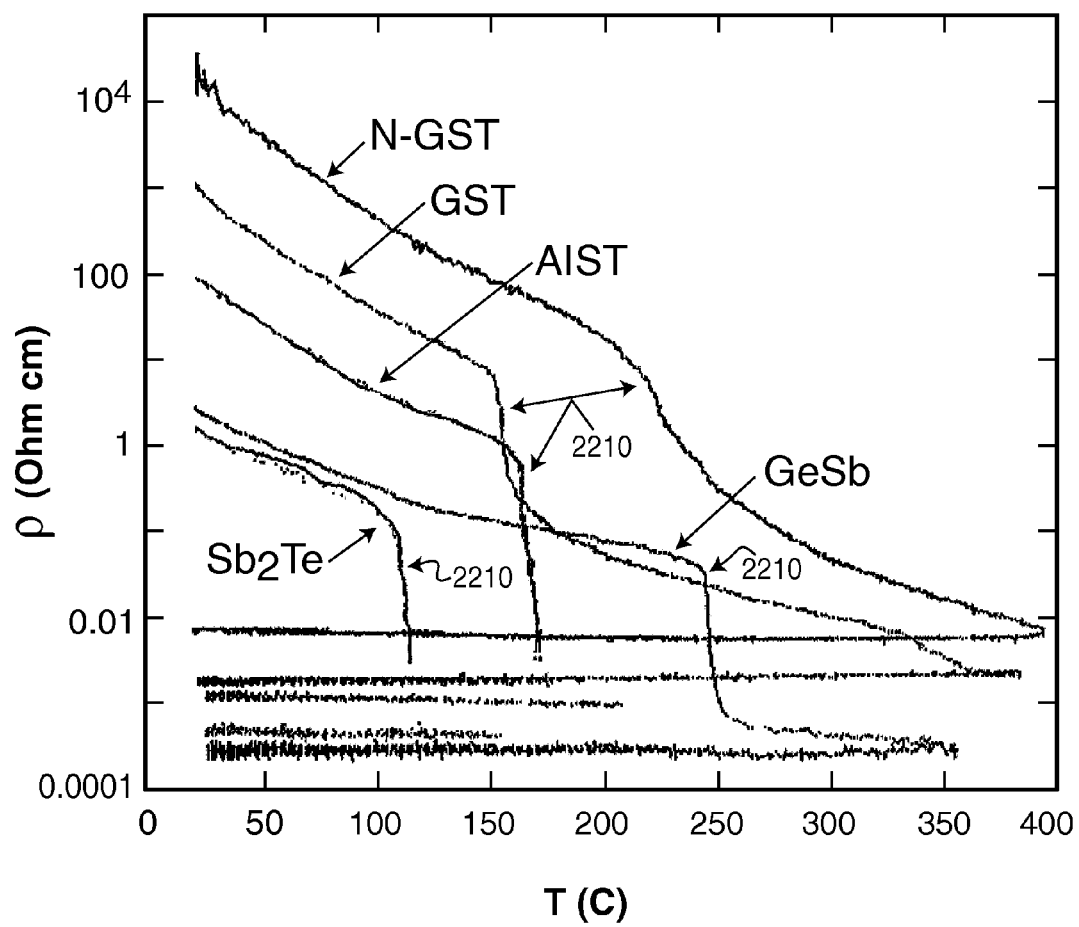
FIG. 2D shows an example of temperature versus resistance in a PCM material.
Figure 2E:
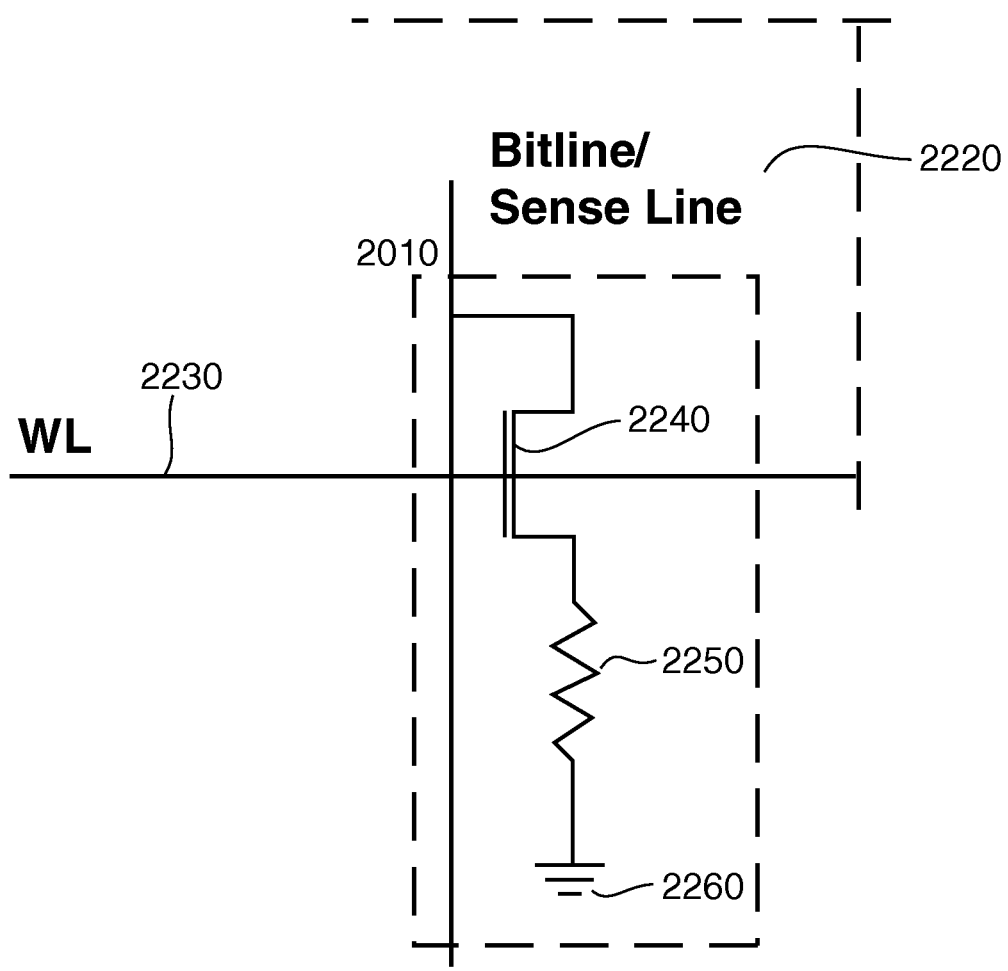
FIG. 2E shows an example of a PCM cell.
Figure 2F:
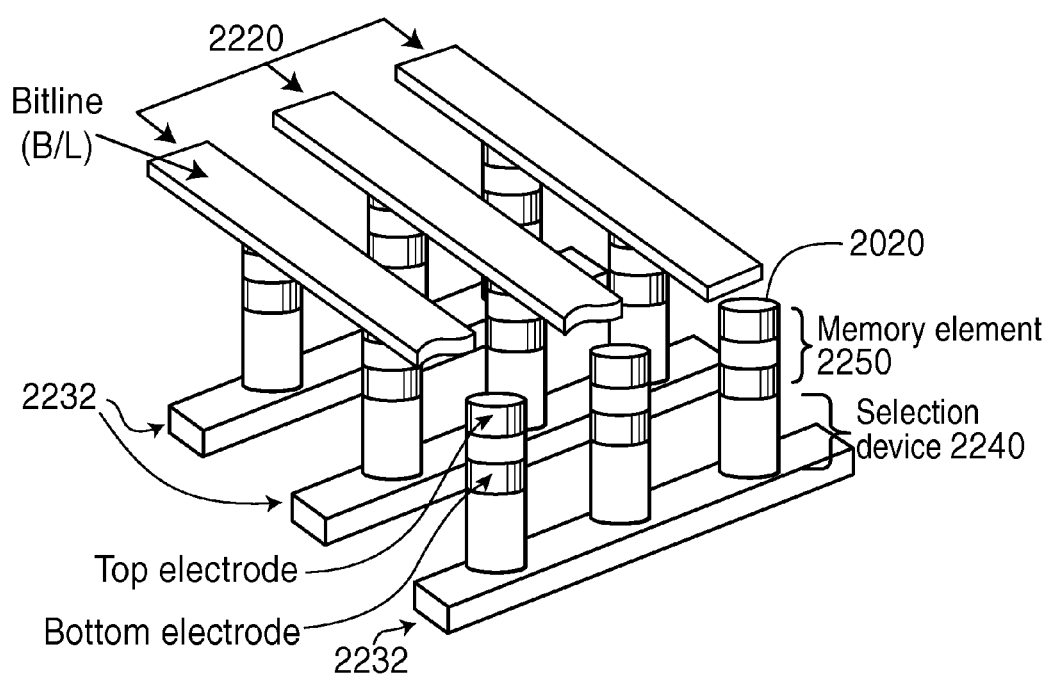
FIG. 2F shows an example of a PCM cell.
Figure 2G:
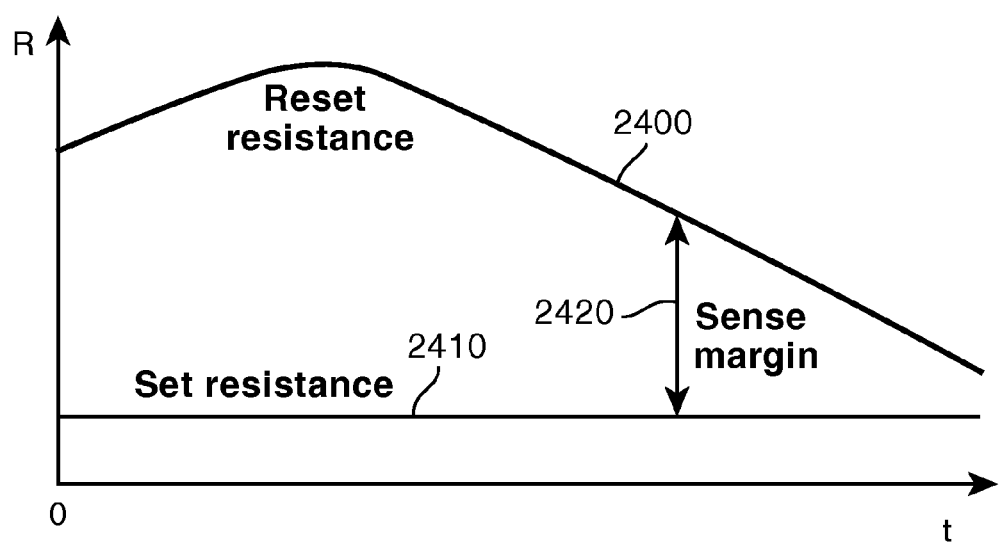
FIG. 2G shows an example of resistance over time for a PCM cell.
Figure 2H:
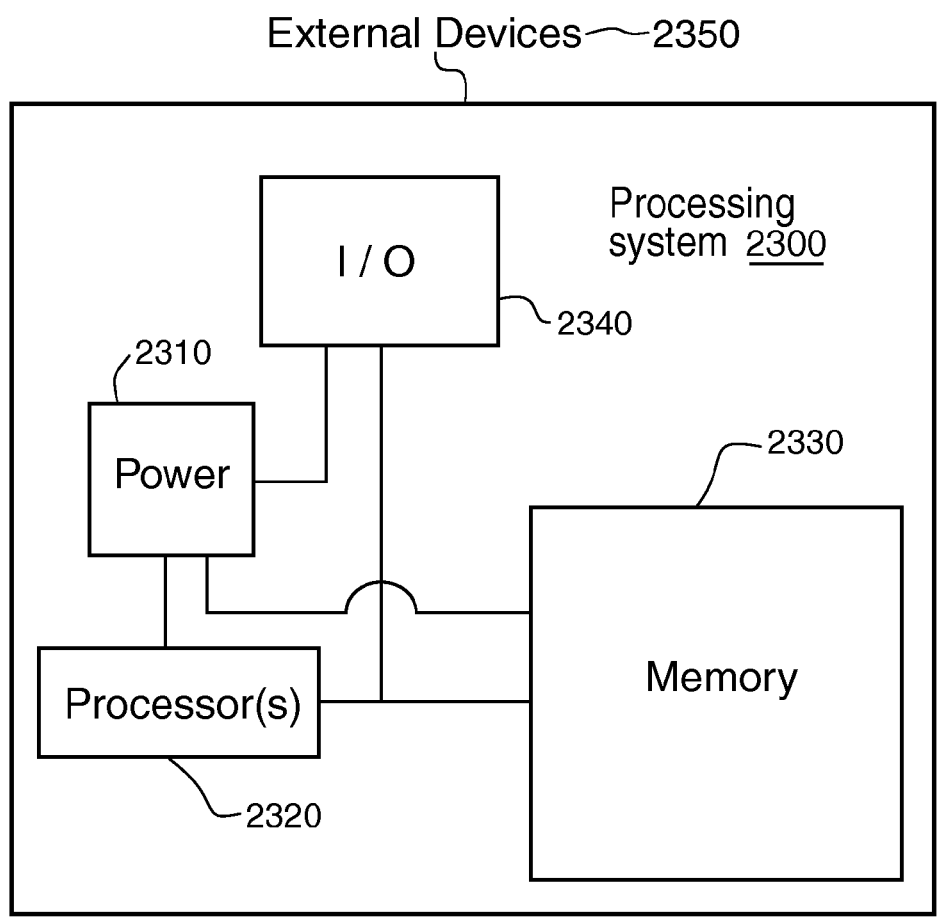
FIG. 2H shows an example of a processing system.
Figure 2I:
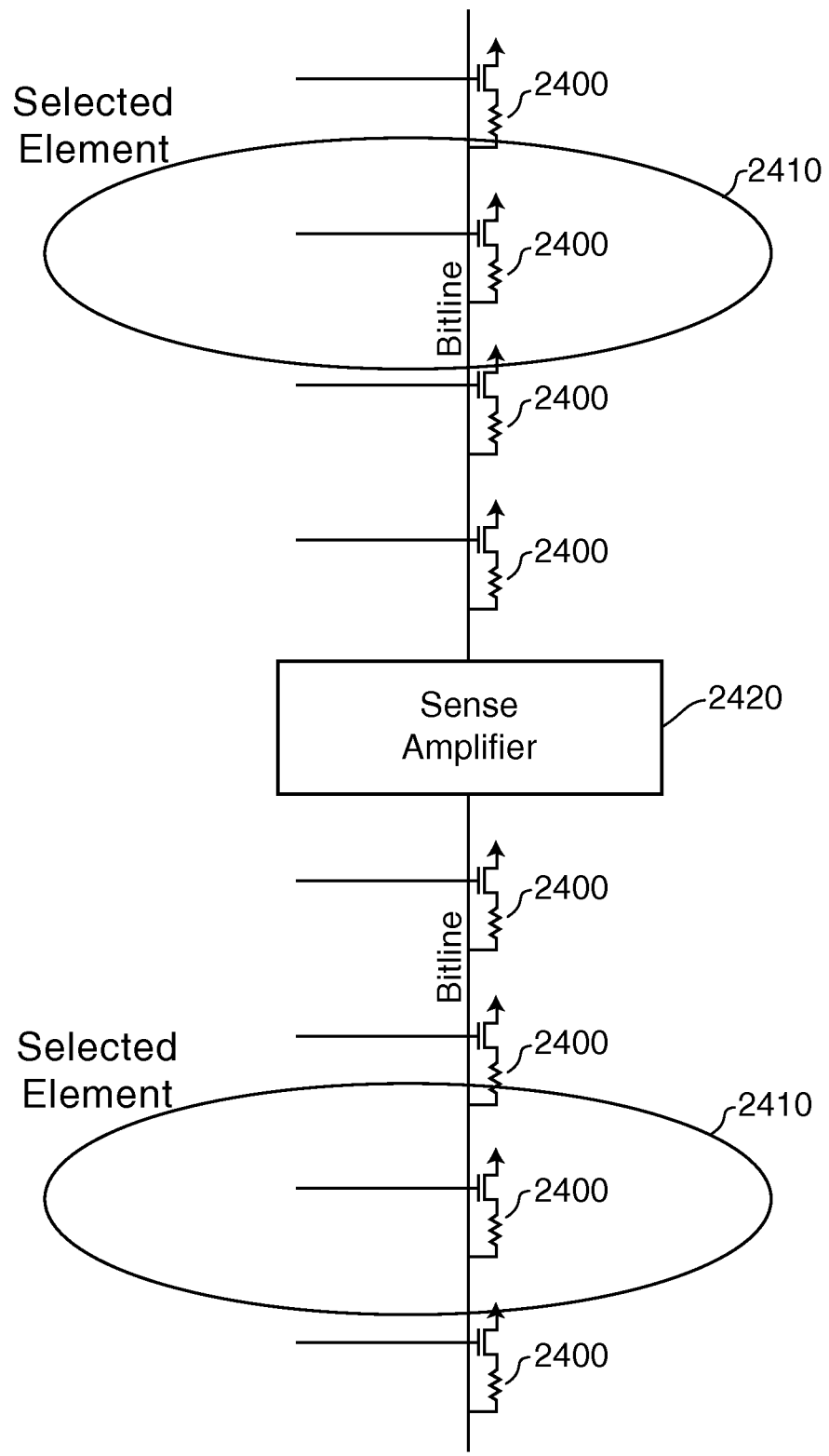
FIG. 2I shows an example of a PCM single ended sensing memory.
Figure 2J:
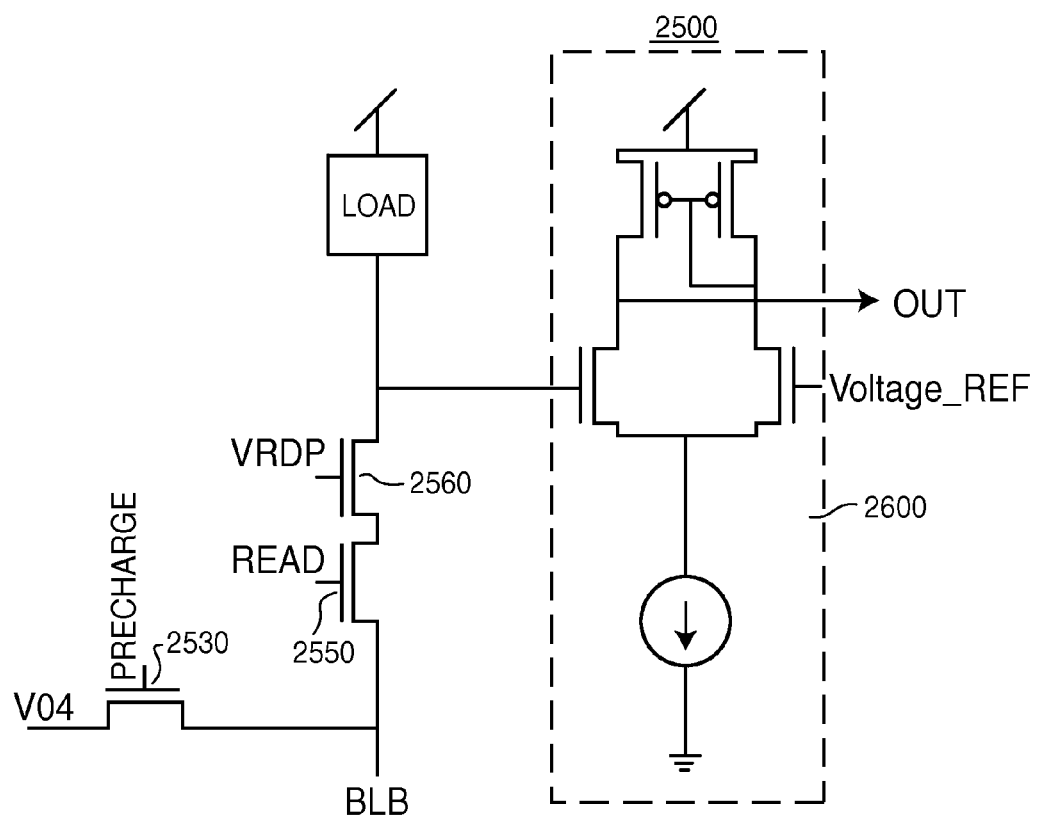
FIG. 2J shows an example of a known PCM single ended sense amplifier.

The numerous innovative teachings of the present application will be described with particular reference to presently preferred embodiments (by way of example, and not of limitation). The present application describes several inventions, and none of the statements below should be taken as limiting the claims generally.

Phase-change memory (PCM) can be used to make high-density non-volatile RAM memory (PCRAM) in a variety of interfaces. It is advantageous to use PCM as non-volatile redundancy memory for PCRAM to store redundancy information to route around PCRAM manufacturing defects; or as non-volatile repair memory to store repair, test, trim or configuration information to tune PCRAM and other component (e.g., processor, input/output controller or power controller) behavior in a design, test, or as-manufactured context.

To increase performance when accessing PCRAM, it is further advantageous to transfer the (for example) redundancy information to a volatile memory for comparisons to determine whether a redundant element is required for a given memory address.

Since PCM is a very promising nonvolatile memory technology, one might consider storing startup information (e.g., redundancy or configuration information) in PCM memory which will be used when a memory array comprising PCM or other memory comes into operation after a complete or partial power-down. However, the present inventor has realized it is surprisingly difficult to determine at what point during a power-on process sufficient voltage is available to perform reliable reads on PCM memory cells; and there are other surprising difficulties to implementation of PCM. Typical power-on detect circuitry generally measures whether basic logic is functional by measuring the thresholds of devices used in the logic. Power-on detect for PCM is significantly more complex, because PCM sense/compare circuitry determines the particular voltage (or current) output as the result of an activated PCM cell and compares that output to signal levels corresponding to PCM bit states. Put another way, typical power-on detect only has to make an on/off determination corresponding to device thresholds; PCM power-on detect has to make an analog determination of signal levels.

The present application discloses implementations for PCM memories which accelerate the start of PCM operation, e.g., from the start of a power-on sequence, to be exactly as fast as possible. To capture the first moment when the behavior of PCM cells permit accurate read operations, the present application discloses a configuration which not only discriminates valid read operations, but also tracks temperature dependence and processing variations in the PCM cells themselves.

To determine whether the supplied voltage can generate proper operating voltages to drive read operations, one or more memory elements with known resistances are activated and test voltages are applied to, e.g., voltage qualification test cells and corresponding sense amplifiers. The resulting cell outputs are used to determine corresponding logical states, substantially similarly to a typical PCM element read, and the results are compared to expected logical states. If the comparisons indicate matches, PCM reads can proceed. If the comparisons indicate match failure, then after a delay the test read procedure repeats.

By causing PCM memory to begin reads earlier in a power-up process, inventive voltage qualification units can save total energy expenditure by, for example, (1) shortening the amount of total time when power to a corresponding memory needs to be on, because if reads begin sooner, then under certain conditions (e.g., when the memory has a finite set of operations, including reads, to complete before power-down that will keep the memory busy) the memory can power-down sooner; and (2) shortening the amount of time that a corresponding memory takes to reply to read requests, thus potentially reducing the number of wasted cycles (and thus wasted energy) in units requesting memory reads.

In some inventive embodiments, a Power On Reset test can be expected to produce an affirmative result before an inventive PCM voltage qualification unit produces a voltage-valid result.

FIG. 1 shows an example of a PCM voltage qualification unit 10. In a preferred embodiment, the voltage qualification unit 10 is configured to cause repair information 20 stored in non-volatile PCM to begin loading into a volatile memory 30—here, SRAM (though other volatile memory technologies can also be used)—once the voltage qualification unit 10 detects a valid PCM read voltage. By using PCM cells to qualify potential read voltages, inventive embodiments determine whether read outputs of high resistance PCM test cells 40 and low resistance PCM test cells 50 in the voltage qualification test unit 10 produce valid logical states at sense amplifiers 60, and that those valid logical states match expected logical states when compared at a compare block 70. Matches are reported (80, READ_VALID) to a controller 90. Once sufficient match results have been reported to the controller 90 (e.g., a long enough streak or other statistical indicator of high probability of reliably valid reads), the controller 90 sends a signal (100, EN_SAMPLE) to cause repair information 20 to begin loading into volatile memory 30.

Sense amplifiers 60 are advantageously on the same data-paths as those used by PCM cells storing repair information 20, so that test cells' read behavior is matched to expected read behavior of the PCM cells storing repair information 20 (or other data-storage cells within corresponding PCM memories). Matched behaviors can include PCM cell responses to temperature changes and responses to variable (e.g., erroneous) voltage inputs.

Repair information, often called test modes (though generally not limited to test configurations), is configuration information and can be, for example, redundancy, trim, test or other configuration information. Redundancy information is generally used to redirect accesses (read and write requests) from defective or otherwise inoperative memory cells to redundant (backup) memory cells. Trim information is generally used to alter the state of an existing topology when device features as-manufactured show variation—which can be expected within some degree of statistical distribution—that can be corrected using measures built into the device. Typically, trim information is determined on a per device (e.g., per chip) basis, and is not accessible to users. Trim can be used to correct, for example, variations in voltage supply outputs or sense amplifier thresholds. Test information can be used to implement test functions, e.g., for device design, design testing or as-manufactured quality assurance purposes. Configuration information can be used, for example, to change timing (e.g., sense amp timing, or setup and hold timing in a data path), internal supply voltages, whether ECC (error correction) or other memory or other component functionality is activated, or other device operation parameters.

In some embodiments, as shown in FIG. 1, one or more pairs of PCM test cells containing preset "high resistance" 40 and preset "low resistance" 50 are accessed by one or more wordlines 110 and bitlines 120, and resulting outputs are analyzed at corresponding sense amplifiers. Sense amplifier outputs are then compared to known resistance (e.g. hardcoded resistances), typically using logic gates (e.g., ANDs and NORs for 1s and 0s, respectively) to make sure the test cells were properly read. If successful reads of the test cells occurred, then volatile memory 30 (SRAM) is caused to begin loading repair information 20, e.g., using an enable sample signal 100 sent by a controller 90 after it receives a valid read signal 80 indicating said successful reads. It is generally advantageous to use multiple pairs of test cells demonstrating successful reads across multiple test read cycles to avoid false positives.

To save chip area, it is advantageous for test cells 40, 50 to share sense amplifiers 60 with PCM cells used for other purposes, e.g., data-storing PCM cells and PCM cells containing non-volatile repair information 20. Test cells 40, 50 can be located in an extended address space, hidden from users.

Figure 3:
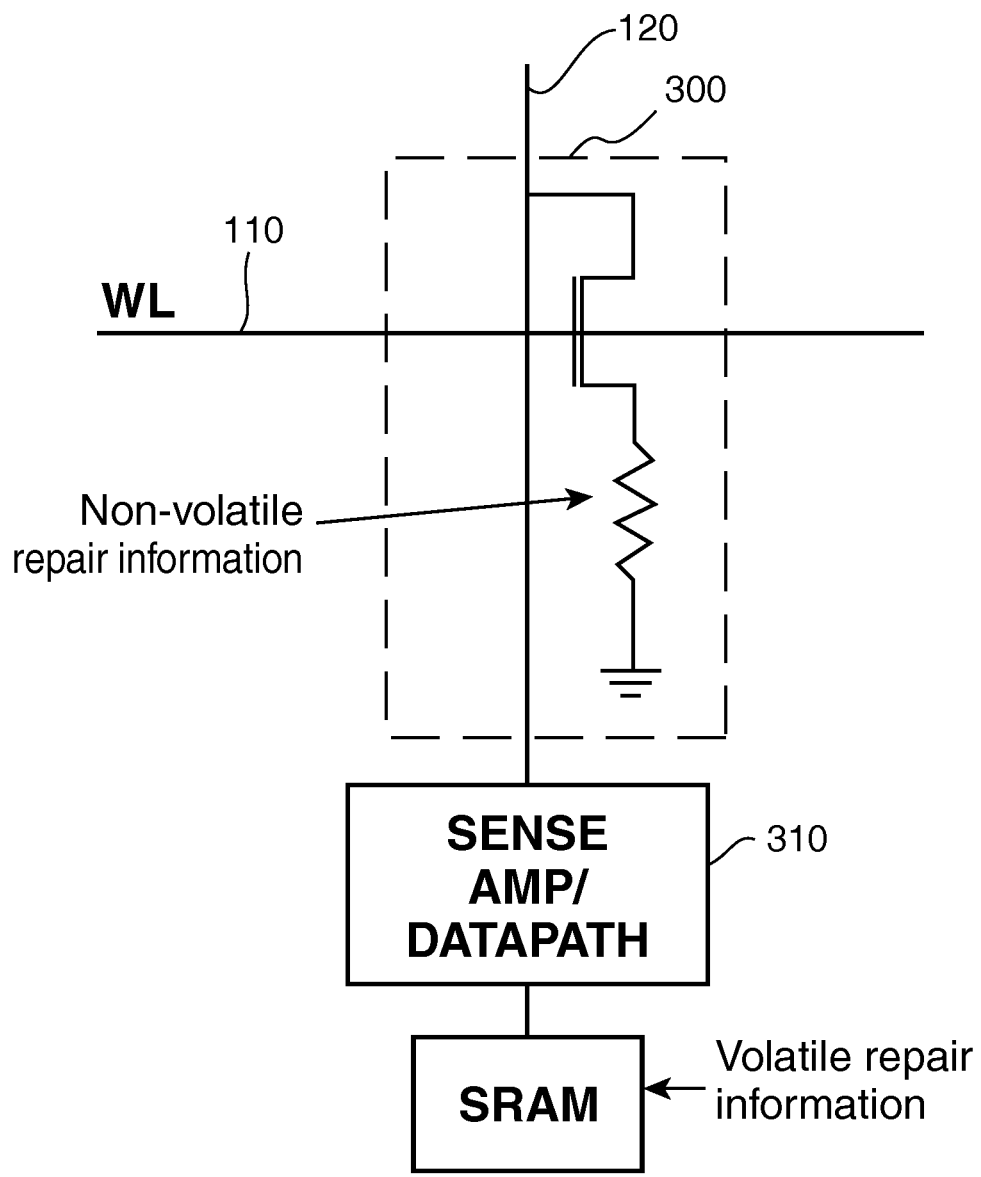
FIG. 3 shows an example of loading information from PCRAM into volatile memory.

FIG. 3 shows an example of loading information from PCRAM into volatile memory. A PCM cell 300 is activated by a corresponding wordline 110 (WL) and bitline 120 (sense line), and the resulting voltage is detected by a sense amplifier 310. The bit output by the sense amplifier 310 is then loaded into volatile memory 30, e.g., SRAM.

Performing this transfer (which requires PCM reads) during power-up, as early in the power-up process as possible—preferably before the minimum complete power-up time has elapsed—can save both time and power. FIG. 4A shows an example of a voltage-time curve at power-up. Voltage 400 (Vcc) starts low at the beginning of power-up (410), rises over time (420), and then levels off when a target stable voltage level is substantially fully achieved (430).

However, as explained, finding the earliest possible time during power-up when PCM reads can reliably be performed is complex and difficult, and can be made more difficult when system specifications do not provide a reset command or allow extremely slow skew rates of the external power supply. FIG. 4B shows an example of a voltage-time curve during power-up of a power supply with a slow skew rate, along with an example of a power-on detect interval 440 ($t_{init}$) when an voltage qualification unit can usefully attempt to detect an adequate voltage for memory operations that is lower than and achieved prior to a target stable voltage 430.

Inventive embodiments incorporate voltage qualification units that detect whether a sense path corresponding to a PCM cell is operational, that is, whether reads on memory cells containing PCM elements along the sense path reliably produce voltage ranges corresponding to PCM bit states.

Figure 5:
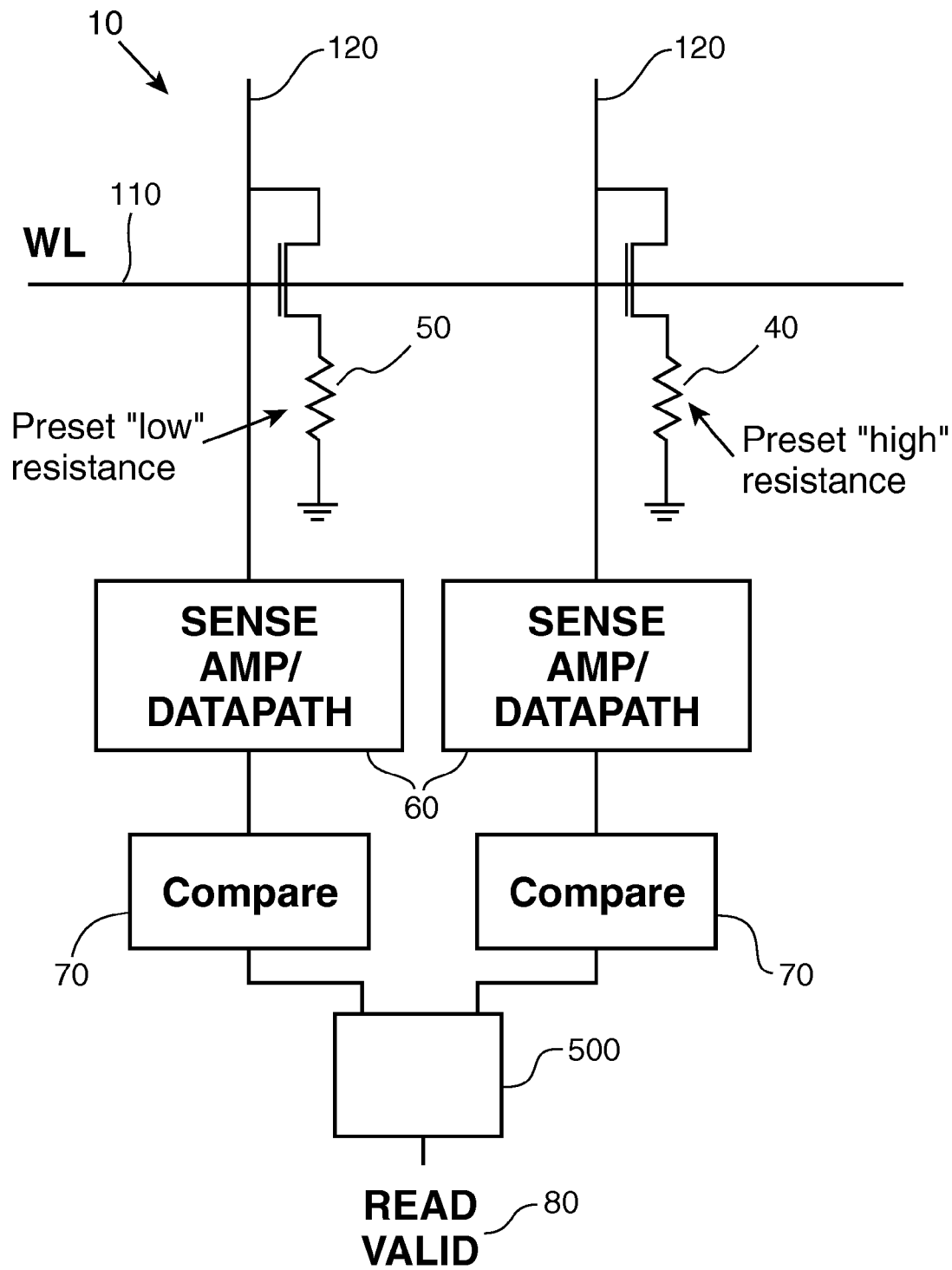
FIG. 5 shows an example of a PCM voltage qualification unit.
Figure 6:
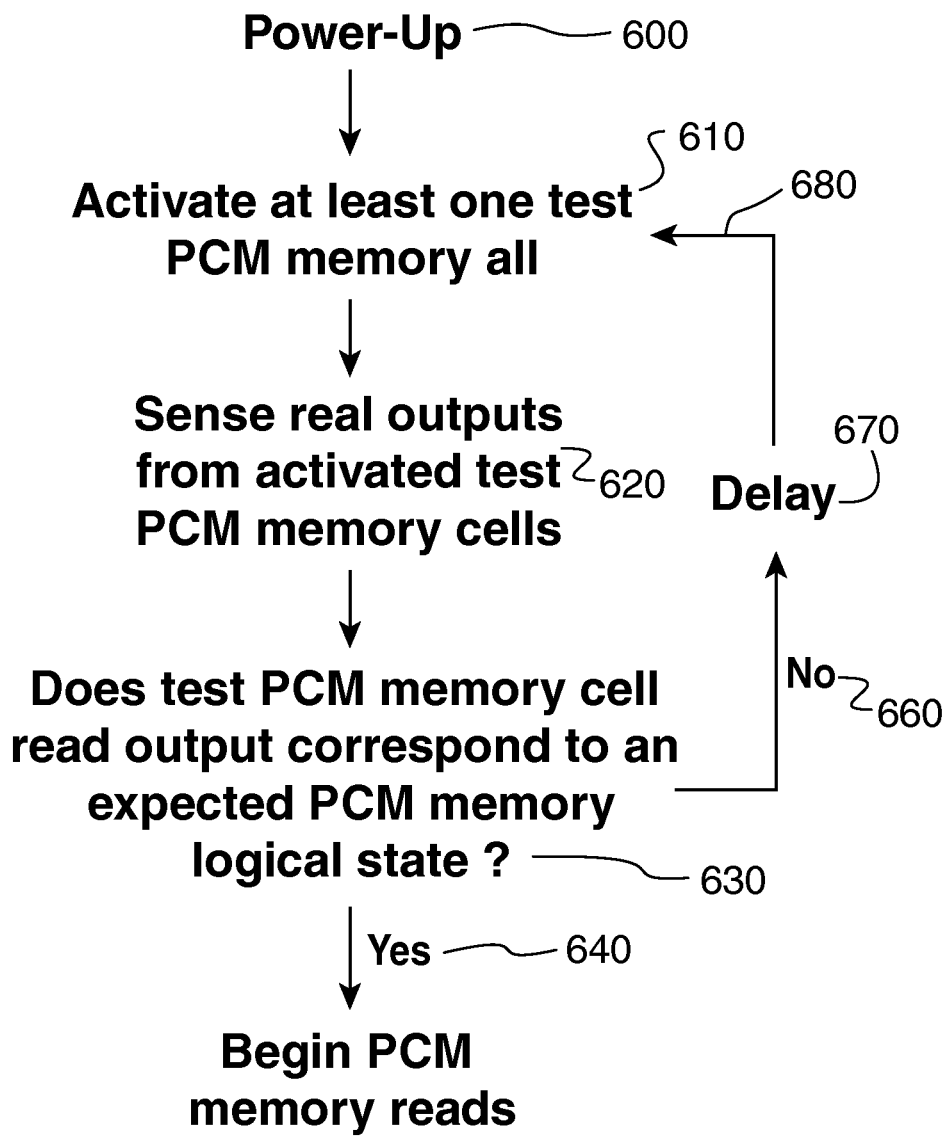
FIG. 6 shows an example of a PCM voltage qualification unit.

FIGS. 5 and 6 show examples of a PCM voltage qualification unit 10. Following Power-Up 600, PCM test cells with preset low resistance 50 (generally, crystalline state) and high resistance 40 (generally, amorphous state) are activated (610) by a wordline 110 (WL) (or respective wordlines) and respective bitlines 120. The resulting read outputs are detected (620) by respective sense amplifiers 60 (Sense Amp/Datapath). The sense amplifier 60 outputs are compared to logical states (essentially, to resistances or read outputs corresponding to resistances) corresponding to the resistances of the PCM test cells by respective compare stages 70, and the results are reviewed (630) by a Read Valid stage 500 (which can be considered to have been incorporated into some embodiments as shown in FIG. 1), e.g. using one or more logic gates. If the PCM cells were correctly read by the input voltage (640), as determined by the sense amplifiers and compare stages, then the voltage qualification is successful and PCM reads can begin (650). Otherwise (660), after a delay (670), the voltage qualification test is repeated 680.

Figure 7A:
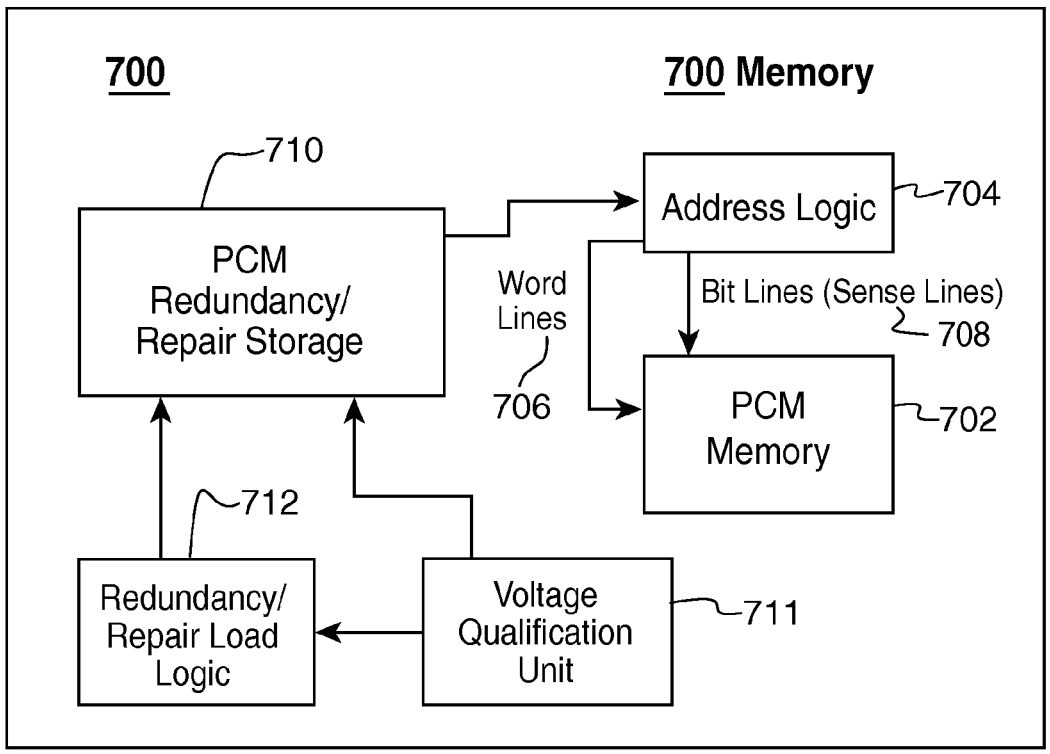
FIG. 7a shows an example of a PCM memory system.

FIG. 7A shows an example of a PCM randomly accessible memory chip 700. Chip 700, in this example, incorporates an array 702 of PCM cells storing instructions and/or data for the system(s) into which the memory system is incorporated. Chip 700 also includes memory addressing logic 704 with which to access specified cells in the memory array using wordlines 706 and bitlines 708 (row and column lines). Chip 700 also includes PCM redundancy memory 710 to store redundancy information regarding which memory array cells are defective, and where calls made to defective cells should be redirected to; redundancy logic 712 to control loading of redundancy information into addressing registers; and a voltage qualification unit 711 to determine, on power-up, when sufficient voltage is available to perform PCM functions. The memory chip can also contain volatile memory, such as SRAM, into which redundancy information is loaded for the purpose of performing fast compares between defective memory addresses and requested memory locations.

Figure 7B:
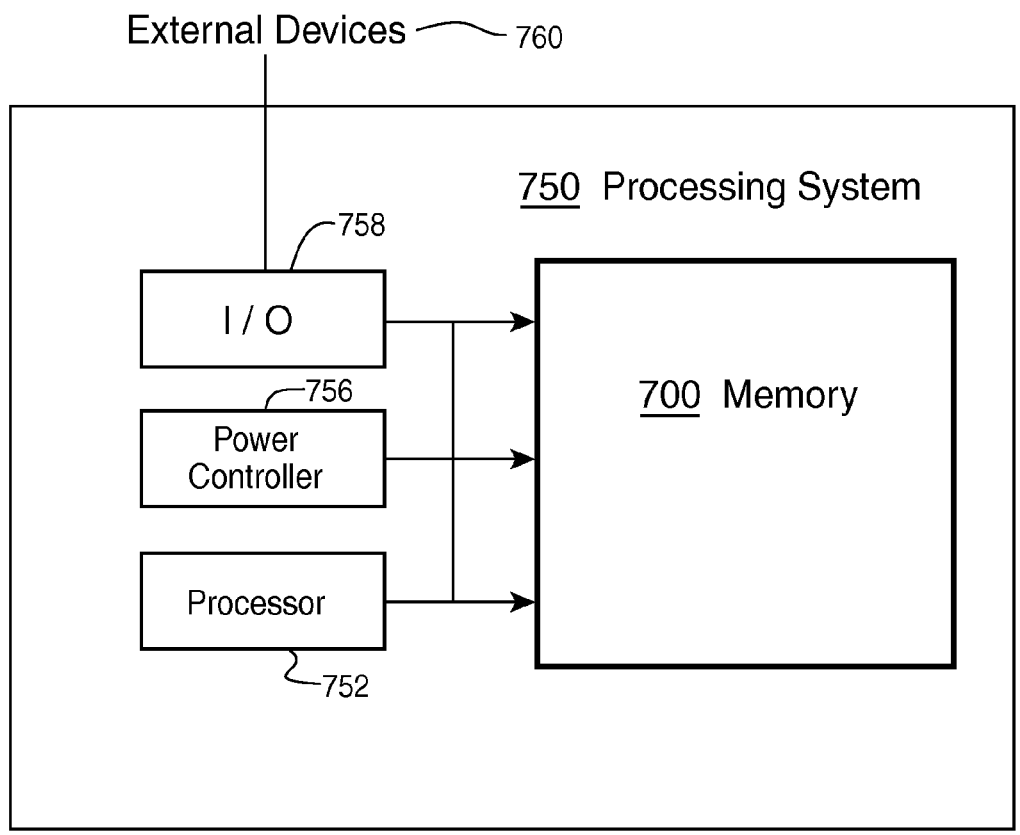
FIG. 7b shows an example of a processing system.

FIG. 7B shows an example of a processing system 750 incorporating a PCM randomly accessible memory 700. The processing system 750 comprises at least one processor 752, power controller 754 connected to manage power from a power source 756, input/output controllers and devices 758 (I/O), and memory 700. The I/O 758 is connected to manage interaction with external devices 760. In the memory 700, data operations requested by the processor 752, power controller 754 or I/O 758 are executed using address logic 704 to select corresponding memory cells within PCM memory 702. On power-up, a voltage qualification test unit 711 determines whether sufficient voltage is available to perform PCM functions. When sufficient voltage is available, PCM redundancy/repair load logic 712 is caused to begin loading repair information from PCM redundancy/repair storage 710 (which is configured to store repair information, such as redundancy information) into address logic 704 so that the access logic 704 can properly access the PCM memory 700, e.g., by redirecting accesses from defective PCM cells to redundant PCM cells.

Figure 8:
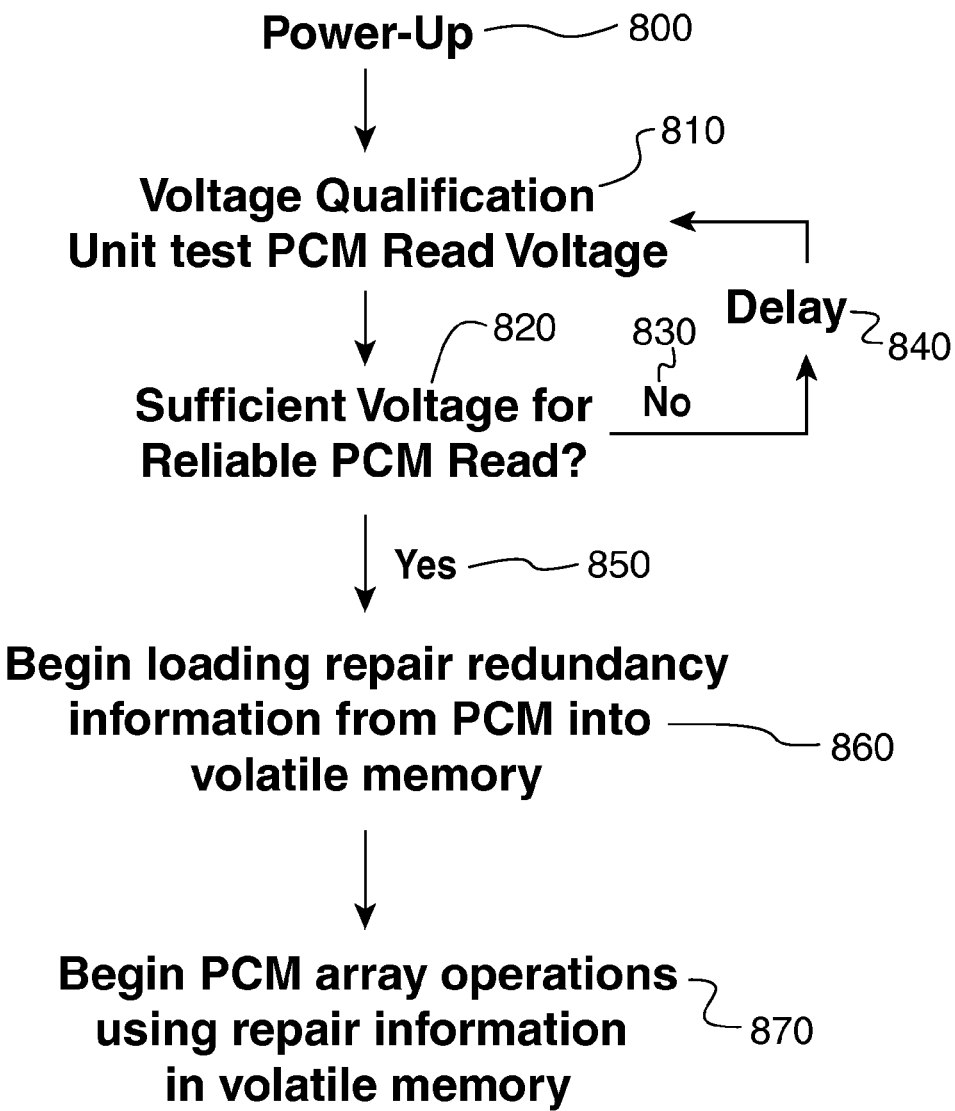
FIG. 8 shows an example of PCM memory power-up.

FIG. 8 shows an example of PCM memory power-up. After power-up (800), a voltage qualification unit begins repeated testing (810) to determine whether sufficient voltage is available for reliable PCM reads (820). If sufficient voltage is not available (830), then after a delay (840) the test 810 is repeated. Once the voltage qualification unit determines that reliable PCM reads are available (850), it causes a PCM redundancy memory to begin loading repair (e.g., redundancy) information into volatile memory (860). Once repair information is loaded and other startup conditions are satisfied, the PCM array can begin performing memory functions (870).

Figure 9:
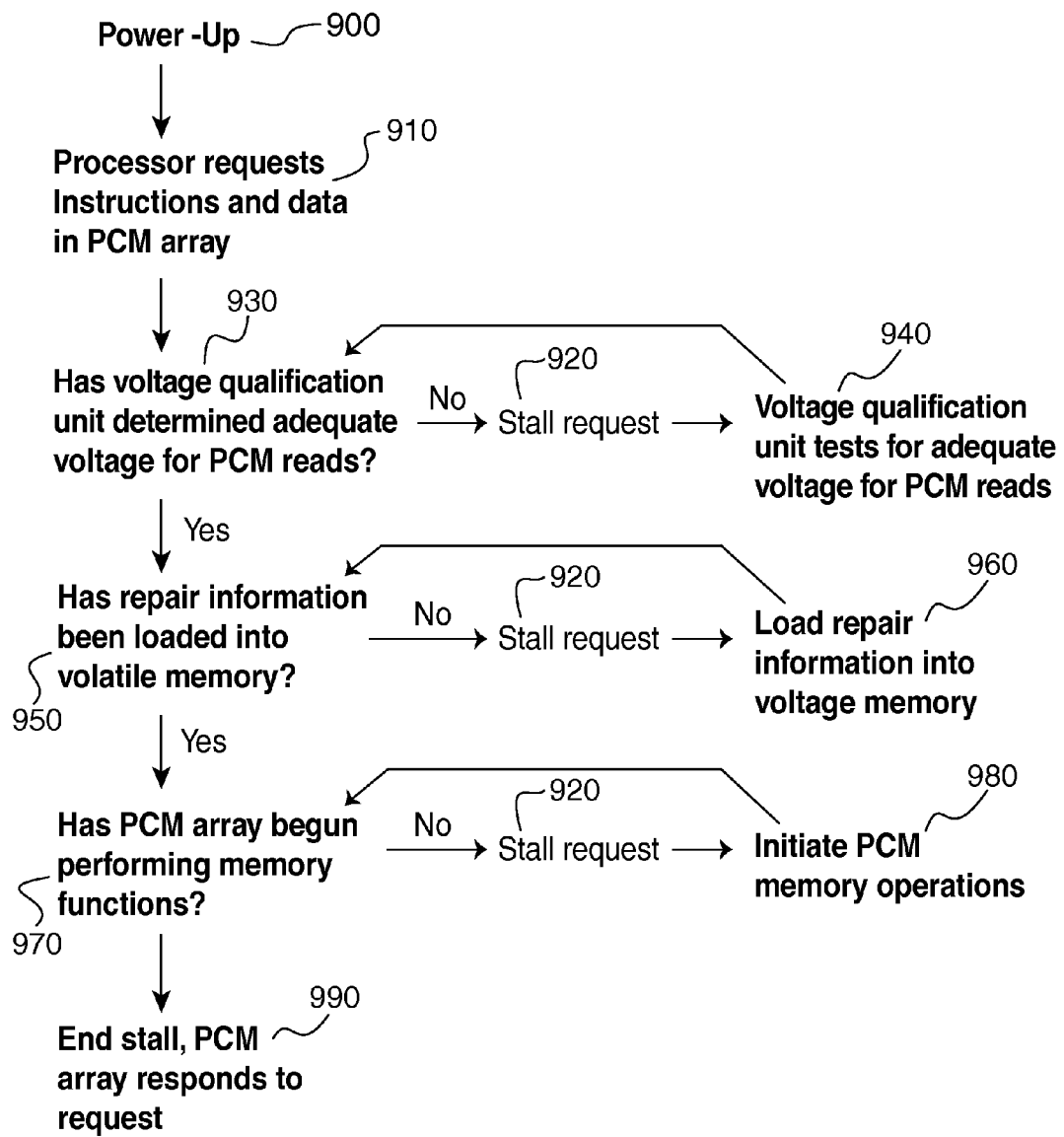
FIG. 9 shows an example of processing system power-up.

FIG. 9 shows an example of processing system power-up. After power-up (900), a processor requests instructions and/or data stored in a PCM array (910). The processor request stalls (920) until a voltage qualification unit has determined (930) that sufficient voltage is available for reliable PCM reads (940). Repair (e.g., redundancy) information is then determined (950) to have been loaded into volatile memory (960); and the PCM array is determined to have begun performing memory functions (970). Once these conditions have been met, addressing logic causes the PCM array to respond to the processor request (990).

Figure 10:
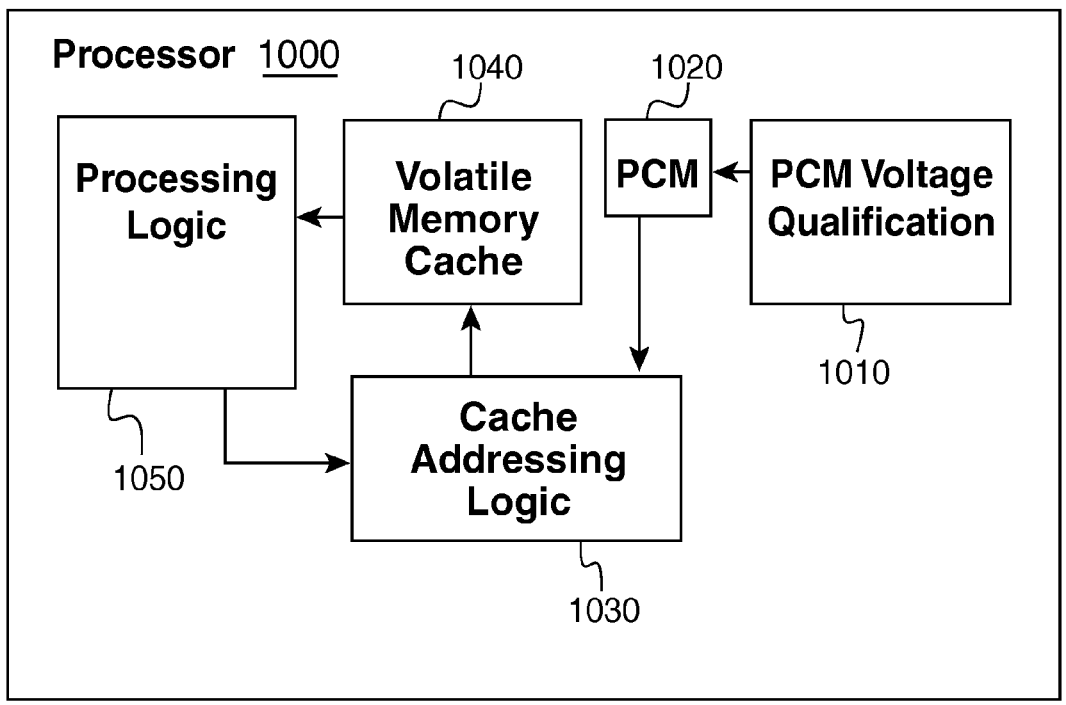
FIG. 10 shows an example of a processing system.

FIG. 10 shows an example of a processing system 1000. After power-on, PCM voltage qualification 1010 determines whether sufficient voltage is available for reliable reads. Once such voltage is available, a PCM unit 1020 loads repair information (e.g., configuration information or a machine execution state from a previous power-down event) into volatile memory in cache addressing logic 1030 or into volatile memory cache 1040 (e.g., as an initial cache state on startup). The cache addressing logic 1030 controls volatile cache 1040 to respond to cache memory requests from processing logic 1050. Processor configuration information can include, for example, any processor operation parameters amenable to adjustment at runtime.

An I/O controller can also be configured as shown in FIG. 10. An I/O controller is generally equivalent to a specialized processor, with I/O control logic corresponding to processing logic.

Figure 11:
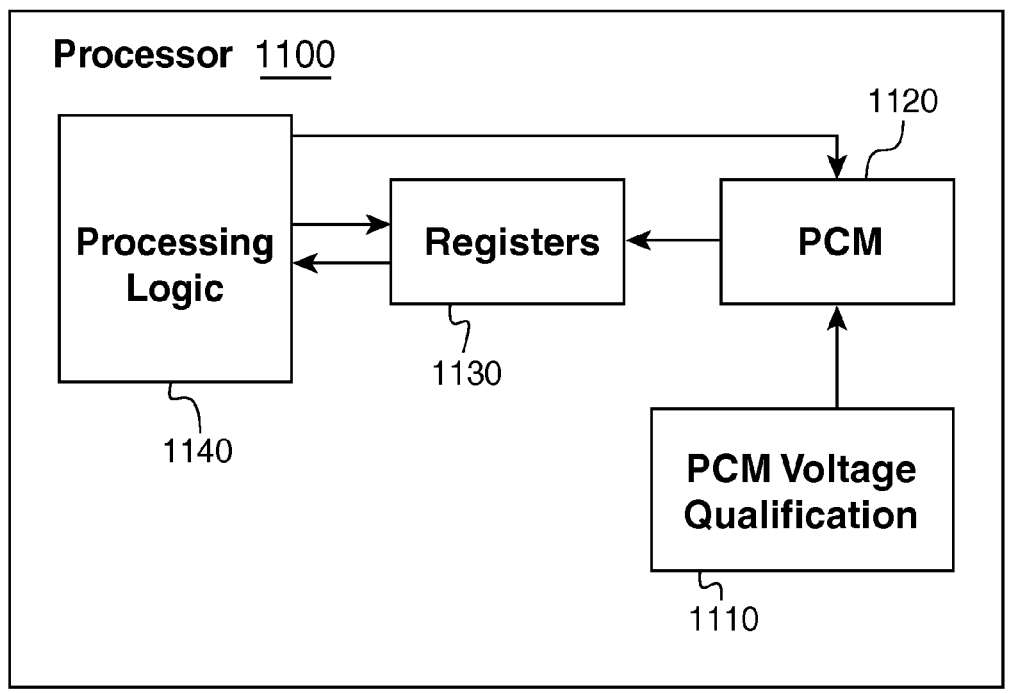
FIG. 11 shows an example of a processing system.

FIG. 11 shows an example of a processor 1100. After power-up, PCM voltage qualification 1110 determines whether sufficient voltage is available for reliable reads. Once such voltage is available, a PCM unit 1120 loads initial state information into volatile memory registers 1130 which are connected to processor 1140. The contents of the PCM unit 1120 can be changed by the processing logic 1140 to reflect a new initial state for a later power-up event. Initial state information can be, for example, static, user-configurable (e.g., from a BIOS), or comprise a prior machine execution state such as the contents of registers and other memory at power-down.

Figure 12:
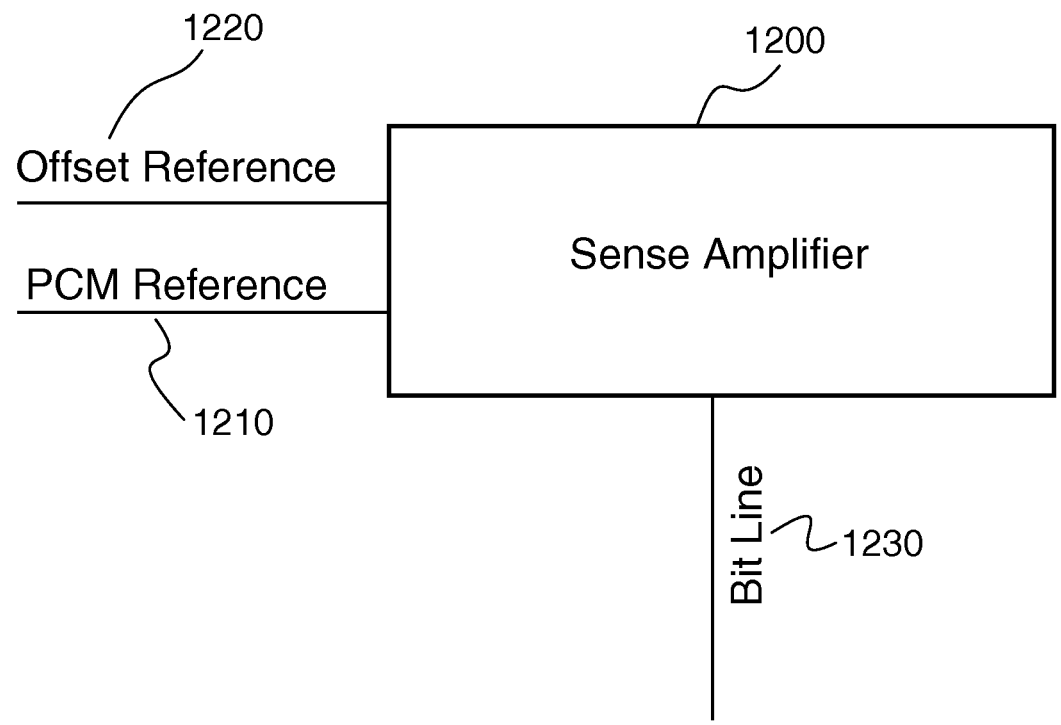
FIG. 12 shows an example of a sense amplifier.

FIG. 12 shows an example of a sense amplifier 1200 in a memory. Sense amplifiers 1200 generally use a reference value 1210 (typically a current) to distinguish between logic states potentially stored in a corresponding memory element and represented by a read output of that element. Here, an Offset Reference 1220—a fine trim used to fine-tune a reference, and unsuitable for use by itself as a reference—appears as an additional input to the Sense Amplifier 1200, where it will be used to modify a reference 1210 prior to comparison between the memory cell read output 1230 and the reference 1210.

The disclosed innovations, in various embodiments, provide one or more of at least the following advantages. However, not all of these advantages result from every one of the innovations disclosed, and this list of advantages does not limit the various claimed inventions.

More agile transitions between power-down and power-up modes;
systems can make more frequent transitions between power-down and power-up modes;
shorter total power-up duration for PCM memory reads;
less total energy usage for PCM memory reads;
less total energy usage by systems incorporating PCM memory;
improved PCM memory read reliability;
faster PCM memory, including lower average memory latency;
less PCM memory power usage;
devices incorporating PCM memory are faster; and
devices incorporating PCM memory use less power, and therefore can operate longer and/or with a smaller power supply;
devices incorporating PCM memory perform operations that require periodic interruption of power conservation modes more quickly and with less power usage; and
fast startup state loading of various parameters.

According to some but not necessarily all embodiments, there is provided: A memory comprising: at least one array of phase change memory cells; redundancy logic which redirects attempted accesses from defective memory elements in said array to redundant memory elements, in dependence on a table of defective memory locations residing in phase change memory when power to the memory is OFF; and a voltage qualification unit configured to test whether reads of a plurality of phase change memory reference cells produce different outputs corresponding to the different logic states stored in said reference cells, and to allow said redundancy logic to begin redirecting accesses only after said outputs correspond to said logic states, wherein said test uses a read voltage generated using said power to the memory.

According to some but not necessarily all embodiments, there is provided: A memory comprising: at least one array of phase change memory cells; a redundancy logic which redirects attempted accesses from defective memory elements in said array to redundant memory elements, in dependence on a table of defective memory locations residing in phase change memory when power to the memory is OFF; and a voltage qualification unit configured to cause said redundancy logic to begin redirecting accesses only after reads of a plurality of phase change memory reference cells are accurate.

According to some but not necessarily all embodiments, there is provided: A memory connectable to be powered from a supply voltage, comprising: at least one redundancy data storage comprising a plurality of phase change memory cells; at least one array of phase change memory cells; at least one access logic controlling access to said array and operating in at least partial dependence on redundancy data stored in said redundancy data storage; and a voltage qualification unit configured to detect whether the supply voltage causes reads of a plurality of phase change memory reference cells to produce correctly distinct outputs corresponding to different logic states stored in said reference cells, wherein said redundancy data storage is operatively connected to enable said access logic only after said voltage qualification unit has detected said correctly distinct outputs.

According to some but not necessarily all embodiments, there is provided: A memory comprising: at least one phase change memory array; a test logic configured to read/write test memory elements in said array, and to write redundancy information corresponding to defective memory elements that fail said read/write testing to a table of defective memory locations, said table residing in phase change memory when power is OFF; a voltage qualification unit configured to test whether reads of multiple phase change memory reference cells produce different outputs corresponding to the different logic states stored in said reference cells, and to allow a redundancy logic to begin redirecting accesses from said defective memory elements to redundant phase change memory elements, in dependence on said table, only after said outputs correspond to said logic states, wherein said test uses a voltage generated using said power to the memory.

According to some but not necessarily all embodiments, there is provided: A processing system comprising: one or more memory units; one or more processors which execute programmable sequence instructions; one or more input/output units; configuration logic which loads configuration information from a phase change memory into a volatile memory, said configuration information residing in said phase change memory when power to the memory is OFF, said configuration information specifying at least one of a machine execution state or at least one operation parameter of at least one of said memory units, said processors and said input/output units; and a voltage qualification unit configured to test whether reads of a plurality of phase change memory reference cells produce different outputs corresponding to the different logic states stored in said reference cells, and to allow said configuration logic to begin loading configuration information only after said outputs correspond to said logic states, wherein said test uses a voltage generated using said power to the memory.

According to some but not necessarily all embodiments, there is provided: A processing system comprising: one or more memory units, one or more processors which execute programmable instruction sequences, and one or more input/output units; repair logic which applies one or more activation voltage variances to adjust feature activation voltages in at least one of said memory units, said processors and said input/output units, said activation voltage variances being at least partially specified by values residing in a phase change memory when power to the memory is OFF; and a voltage qualification unit configured to test whether reads of a plurality of phase change memory reference cells produce different outputs corresponding to the different logic states stored in said reference cells, and to allow said repair logic to begin adjusting feature activation voltages only after said outputs correspond to said logic states, wherein said test uses a voltage generated using said power to the memory.

According to some but not necessarily all embodiments, there is provided: A processing system comprising: a phase change memory unit, a processor which executes programmable instruction sequences, an input/output unit, and configuration logic which loads configuration information from said phase change memory when power is turned on; a voltage qualification unit configured to test whether reads of a plurality of phase change memory reference cells of said phase change memory unit, after power is turned on, produce correctly distinct outputs corresponding to the different logic states stored in said reference cells; wherein said configuration logic begins loading the configuration information only if said voltage qualification unit confirms said reads produce said correctly distinct outputs, and wherein said processor and/or said input/output unit operate external elements in accordance with said configuration data.

According to some but not necessarily all embodiments, there is provided: A method of accessing a memory comprising: redirecting attempted accesses from defective memory elements in an array of phase change memory cells to redundant memory elements using a redundancy logic, said redirecting being performed in dependence on a table of defective memory locations residing in phase change memory when power to the memory is OFF; and testing, using a voltage qualification unit, whether reads of a plurality of phase change memory reference cells produce different outputs corresponding to the different logic states stored in said reference cells; and allowing said redundancy logic to begin redirecting accesses only after said outputs correspond to said logic states, wherein said testing uses a read voltage generated using said power to the memory.

According to some but not necessarily all embodiments, there is provided: A method of accessing a memory comprising: redirecting attempted accesses from defective memory elements in at least one array of phase change memory cells to redundant memory elements using a redundancy logic, said redirecting being performed in dependence on a table of defective memory locations residing in phase change memory when power to the memory is OFF; and causing said redundancy logic to begin redirecting accesses, using a voltage qualification unit, only after reads of a plurality of phase change memory reference cells are accurate.

According to some but not necessarily all embodiments, there is provided: A method of accessing a memory comprising: controlling access to at least one array of phase change memory cells, using an access logic, said controlling being in at least partial dependence on redundancy data stored in at least one redundancy data storage, said redundancy data storage comprising a plurality of phase change memory cells; and detecting, using a voltage qualification unit, whether the supply voltage causes reads of a plurality of phase change memory reference cells to produce correctly distinct outputs corresponding to different logic states stored in said reference cells, enabling said access logic only after said voltage qualification unit has detected said correctly distinct outputs.

According to some but not necessarily all embodiments, there is provided: A method of accessing a memory comprising: loading configuration information, using a configuration logic, from a phase change memory into a volatile memory, said configuration information residing in said phase change memory when power to the memory is OFF, said configuration information specifying at least one of a machine execution state or at least one operation parameter of at least one of one or more memory units, one or more processors which execute programmable sequence instructions, and one or more input/output units; and testing, using a voltage qualification unit, whether reads of a plurality of phase change memory reference cells produce different outputs corresponding to the different logic states stored in said reference cells, and to allow said configuration logic to begin loading configuration information only after said outputs correspond to said logic states, wherein said test uses a voltage generated using said power to the memory.

According to some but not necessarily all embodiments, there is provided: A method of operating a processing system comprising: applying one or more activation voltage variances, using a repair logic, to adjust feature activation voltages in at least one of one or more memory units, one or more processors which execute programmable sequence instructions and one or more input/output units, said activation voltage variances being at least partially specified by values residing in a phase change memory when power to the memory is OFF; and testing whether an input voltage generated using said power to the memory causes one or more phase change memory outputs to correspond to logic states stored in corresponding phase change memory cells; and allowing said repair logic to begin adjusting said feature activation voltages only after said outputs correspond to said logic states.

According to some but not necessarily all embodiments, there is provided: A method of accessing a memory comprising: read/write testing memory elements in at least one phase change memory array; writing redundancy information corresponding to defective memory elements that fail said read/write testing to a table of defective memory locations, said table residing in phase change memory when power to the memory is OFF; testing whether an input voltage generated using power to the memory causes different read outputs of multiple phase change memory reference cells to correspond to different logic states stored in said reference cells; and allowing a redundancy logic to begin redirecting accesses from said defective memory elements to redundant phase change memory elements in dependence on said table, only after said read outputs correspond to said logic states.

According to some but not necessarily all embodiments, there is provided: A memory comprising: at least one array of phase change memory cells; redundancy logic which redirects attempted accesses from defective memory elements in said array to redundant memory elements, in dependence on a table of defective memory locations residing in phase change memory when power to the memory is OFF; and a voltage qualification unit configured to test whether reads of a plurality of phase change memory reference cells produce different outputs corresponding to the different logic states stored in said reference cells, and to allow said redundancy logic to begin redirecting accesses only after said outputs correspond to said logic states, wherein said test uses a read voltage generated using said power to the memory.

According to some but not necessarily all embodiments, there is provided: A memory comprising: at least one array of phase change memory cells; a redundancy logic which redirects attempted accesses from defective memory elements in said array to redundant memory elements, in dependence on a table of defective memory locations residing in phase change memory when power to the memory is OFF; and a voltage qualification unit configured to cause said redundancy logic to begin redirecting accesses only after reads of a plurality of phase change memory reference cells are accurate.

According to some but not necessarily all embodiments, there is provided: A memory connectable to be powered from a supply voltage, comprising: at least one redundancy data storage comprising a plurality of phase change memory cells; at least one array of phase change memory cells; at least one access logic controlling access to said array and operating in at least partial dependence on redundancy data stored in said redundancy data storage; and a voltage qualification unit configured to detect whether the supply voltage causes reads of a plurality of phase change memory reference cells to produce correctly distinct outputs corresponding to different logic states stored in said reference cells, wherein said redundancy data storage is operatively connected to enable said access logic only after said voltage qualification unit has detected said correctly distinct outputs.

According to some but not necessarily all embodiments, there is provided: A memory comprising: at least one phase change memory array; a test logic configured to read/write test memory elements in said array, and to write redundancy information corresponding to defective memory elements that fail said read/write testing to a table of defective memory locations, said table residing in phase change memory when power is OFF; a voltage qualification unit configured to test whether reads of multiple phase change memory reference cells produce different outputs corresponding to the different logic states stored in said reference cells, and to allow a redundancy logic to begin redirecting accesses from said defective memory elements to redundant phase change memory elements, in dependence on said table, only after said outputs correspond to said logic states, wherein said test uses a voltage generated using said power to the memory.

According to some but not necessarily all embodiments, there is provided: A method of accessing a memory comprising: redirecting attempted accesses from defective memory elements in an array of phase change memory cells to redundant memory elements using a redundancy logic, said redirecting being performed in dependence on a table of defective memory locations residing in phase change memory when power to the memory is OFF; and testing, using a voltage qualification unit, whether reads of a plurality of phase change memory reference cells produce different outputs corresponding to the different logic states stored in said reference cells, wherein said testing uses a read voltage generated using said power to the memory.

According to some but not necessarily all embodiments, there is provided: A method of accessing a memory comprising: redirecting attempted accesses from defective memory elements in at least one array of phase change memory cells to redundant memory elements using a redundancy logic, said redirecting being performed in dependence on a table of defective memory locations residing in phase change memory when power to the memory is OFF; and causing said redundancy logic to begin redirecting accesses, using a voltage qualification unit, only after reads of a plurality of phase change memory reference cells are accurate.

According to some but not necessarily all embodiments, there is provided: A method of accessing a memory comprising: controlling access to at least one array of phase change memory cells, using an access logic, said controlling being in at least partial dependence on redundancy data stored in at least one redundancy data storage, said redundancy data storage comprising a plurality of phase change memory cells; and detecting, using a voltage qualification unit, whether the supply voltage causes reads of a plurality of phase change memory reference cells to produce correctly distinct outputs corresponding to different logic states stored in said reference cells, enabling said access logic only after said voltage qualification unit has detected said correctly distinct outputs.

According to some but not necessarily all embodiments, there is provided: A method of accessing a memory comprising: read/write testing memory elements in at least one phase change memory array; writing redundancy information corresponding to defective memory elements that fail said read/write testing to a table of defective memory locations, said table residing in phase change memory when power to the memory is OFF; testing whether an input voltage generated using power to the memory causes different read outputs of multiple phase change memory reference cells to correspond to different logic states stored in said reference cells; and allowing a redundancy logic to begin redirecting accesses from said defective memory elements to redundant phase change memory elements in dependence on said table, only after said read outputs correspond to said logic states.

According to some but not necessarily all embodiments, there is provided: The present application discloses phase-change memory architectures and methods, in which an additional test is performed, after the normal power-valid signal, to assure that the phase-change memory components which are used for storing configuration data are able to operate correctly. Surprisingly, the inventor has discovered that this additional test is highly desirable when using phase-change memory for configuration data.

According to some but not necessarily all embodiments, there is provided: A processing system comprising: one or more memory units, one or more processors which execute programmable instruction sequences, and one or more input/output units; configuration logic which loads configuration information from a phase change memory into a volatile memory, said configuration information residing in said phase change memory when power to the memory is OFF, said configuration information specifying at least one of a machine execution state or at least one operation parameter of at least one of said memory units, said processors and said input/output units; and a voltage qualification unit configured to test whether reads of a plurality of phase change memory reference cells produce different outputs corresponding to the different logic states stored in said reference cells, and to allow said configuration logic to begin loading configuration information only after said outputs correspond to said logic states, wherein said test uses a voltage generated using said power to the memory.

According to some but not necessarily all embodiments, there is provided: A processing system comprising: one or more memory units, one or more processors which execute programmable instruction sequences, and one or more input/output units; repair logic which applies one or more activation voltage variances to adjust feature activation voltages in at least one of said memory units, said processors and said input/output units, said activation voltage variances being at least partially specified by values residing in a phase change memory when power to the memory is OFF; and a voltage qualification unit configured to test whether reads of a plurality of phase change memory reference cells produce different outputs corresponding to the different logic states stored in said reference cells, and to allow said repair logic to begin adjusting feature activation voltages only after said outputs correspond to said logic states, wherein said test uses a voltage generated using said power to the memory.

According to some but not necessarily all embodiments, there is provided: A processing system comprising: a phase change memory unit, a processor which executes programmable instruction sequences, an input/output unit, and configuration logic which loads configuration information from said phase change memory when power is turned on; a voltage qualification unit configured to test whether reads of a plurality of phase change memory reference cells of said phase change memory unit, after power is turned on, produce correctly distinct outputs corresponding to the different logic states stored in said reference cells; wherein said configuration logic begins loading the configuration information only if said voltage qualification unit confirms said reads produce said correctly distinct outputs, and wherein said processor and/or said input/output unit operate external elements in accordance with said configuration data.

According to some but not necessarily all embodiments, there is provided: A method of operating a processing system comprising: loading configuration information, using a configuration logic, from a phase change memory into a volatile memory, said configuration information residing in said phase change memory when power to the memory is OFF, said configuration information specifying at least one of a machine execution state or at least one operation parameter of at least one of one or more memory units, one or more processors which execute programmable sequence instructions, and one or more input/output units; and testing, using a voltage qualification unit, whether reads of a plurality of phase change memory reference cells produce different outputs corresponding to the different logic states stored in said reference cells, and to allow said configuration logic to begin loading configuration information only after said outputs correspond to said logic states, wherein said test uses a voltage generated using said power to the memory.

According to some but not necessarily all embodiments, there is provided: A method of operating a processing system comprising: applying one or more activation voltage variances, using a repair logic, to adjust feature activation voltages in at least one of one or more memory units, one or more processors which execute programmable sequence instructions and one or more input/output units, said activation voltage variances being at least partially specified by values residing in a phase change memory when power to the memory is OFF; and testing whether an input voltage generated using said power to the memory causes one or more phase change memory outputs to correspond to logic states stored in corresponding phase change memory cells; and allowing said repair logic to begin adjusting said feature activation voltages only after said outputs correspond to said logic states.

According to some but not necessarily all embodiments, there is provided: Systems in which PCM is used, including memory systems, as well as methods for operating such systems. A test of PCM memory elements with known states can be used to determine whether immediately available voltage levels can reliably read PCM. This can be used to accelerate availability of memory states residing in PCM with respect to, for example, redundancy address storage, other startup state information, and parameters for which nonvolatile storage is useful.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

In some embodiments, PCM is used in contexts in which embedded DRAM is typically used.

In some embodiments, PCM is used for CPU on-chip memory.

In some embodiments, PCM is used in on-chip memory contexts where field-programmable gate array (FPGA) memory is typically used.

In some embodiments, PCM can be used to load a startup state into device registers, e.g., CPU registers.

In some embodiments, PCM can be used with multiple other memory types on a single chip.

In some embodiments, more than one low resistance and/or more than one high resistance can be used in the PCM cells in the voltage qualification unit.

In some embodiments, information is stored in PCM cells for startup procedures other than defective memory repair.

In some embodiments using multiple high/low pairs of PCM cells in a voltage qualification unit, at least one high/low pair of PCM cells within the voltage qualification unit is not rewritten, either (1) for an extended period of time or (2) ever.

In some embodiments using multiple high/low pairs of PCM cells in a voltage qualification unit, at least one high/low pair of PCM cells within the voltage qualification unit is transposed at random intervals when a corresponding memory's power is on.

In some embodiments, phase change memory cells can contain multiple phase change memory elements, ones of said memory elements having separate readable states.

In some embodiments using multiple high/low pairs of PCM cells in a voltage qualification unit, at least one high/low pair of PCM cells within the voltage qualification unit is transposed when certain conditions are met, e.g., after a certain number of reads or writes, after a certain amount of time, after a certain amount of time when a corresponding memory's power is on, after a certain number of voltage qualification tests, after a certain number of voltage-valid voltage qualification test results, or after every power-on.

In some embodiments, different high/low pairs can have different transposition criteria.

In some embodiments, both SET and RESET pulses reset PCM cell drift characteristics of both "0" and "1" logical states, i.e., without requiring a logical state transposition to reset cell drift characteristics.

In some embodiments, outputs of pairs of high and low resistance PCM cells are compared to each other, e.g., using a logic gate, after having been read by a sense amplifier.

In some embodiments, high/low PCM test cells are not paired.

In some embodiments, the number of high resistance PCM test cells is different from the number of low resistance PCM test cells.

Additional general background, which helps to show variations and implementations, may be found in the following publications, all of which are hereby incorporated by reference: Lam, Chung. "Phase Change Memory: A Replacement or Transformational Memory Technology," IEEE Workshop on Microelectronics and Electron Devices (WMED), c. 2011. Choi, Youngdon, et al. "A 20 nm 1.8V 8 Gb PRAM with 40 MB/s Program Bandwidth." ISSCC 2012/Session 2/High Bandwidth DRAM & PRAM/2.5. c. 2012.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

Additional general background, which helps to show variations and implementations, as well as some features which can be synergistically with the inventions claimed below, may be found in the following US patent applications. All of these applications have at least some common ownership, copendency, and inventorship with the present application, and all of them are hereby incorporated by reference: U.S. Provisional Pat. Nos. 61/637,331; 61/637,496; 61/637,513; 61/637,518; 61/637,526; 61/637,533; 61/638,217; 61/694,217; 61/694,220; 61/694,221; 61/694,223; 61/694,224; 61/694,225; 61/694,228; 61/694,234; 61/694,240; 61/694,242; 61/694,243; and 61/694,245.

The claims as filed are intended to be as comprehensive as possible, and NO subject matter is intentionally relinquished, dedicated, or abandoned.

What is claimed is:

1. A memory comprising:
   at least one array of phase change memory cells;
   redundancy logic which redirects attempted accesses from defective memory elements in said array to redundant memory elements, in dependence on a table of defective memory locations residing in phase change memory when power to the memory is OFF; and
   a voltage qualification unit configured to test whether reads of a plurality of phase change memory reference cells produce different outputs corresponding to the different logic states stored in said reference cells, and to allow said redundancy logic to begin redirecting accesses only after said outputs correspond to said logic states,
   wherein said test uses a read voltage generated using said power to the memory.

2. The memory of claim 1, further comprising repair logic which applies one or more activation voltage variances to adjust feature activation voltages in said memory, said activation voltage variances being at least partially specified by values residing in a phase change memory when power to the memory is OFF, wherein said voltage qualification unit is configured to allow said repair logic to begin adjusting said feature activation voltages only after said outputs correspond to said logic states.

3. The memory of claim 2, wherein said activation voltage variances correct for differences between designed feature activation voltages and as-manufactured feature activation voltages.

4. The memory of claim 1, wherein said reference cells comprise one or more pairs of reference cells configured to store complementary logic states.

5. The memory of claim 1, further comprising configuration logic which loads configuration information from a phase change memory into a volatile memory, said configuration information residing in said phase change memory when power to the memory is OFF, said configuration information at least partially determining one or more operation parameters of said memory, wherein said voltage qualification unit is configured to allow said configuration logic to begin loading configuration information only after said outputs correspond to said logic states.

6. The memory of claim 5, wherein said operation parameters comprise one or more of internal supply voltages, sense amplifier timings, setup timings in data paths, hold timings in data paths, and an ON/OFF state of one or more memory functions.

7. The memory of claim 1, wherein different numbers of reference cells store different ones of said different logic states.

8. The memory of claim 1, wherein said testing comprises performing multiple comparisons between said outputs and said logic states, and said corresponding comprises a predetermined number of uninterrupted matches between said outputs and said logic states.

9. A memory comprising:
   at least one array of phase change memory cells;
   a redundancy logic which redirects attempted accesses from defective memory elements in said array to redundant memory elements, in dependence on a table of defective memory locations residing in phase change memory when power to the memory is OFF; and
   a voltage qualification unit configured to cause said redundancy logic to begin redirecting accesses only after reads of a plurality of phase change memory reference cells are accurate.

10. The memory of claim 9, further comprising repair logic which applies one or more activation voltage variances to adjust feature activation voltages in said memory, said activation voltage variances being at least partially specified by values residing in a phase change memory when power to the memory is OFF, wherein said voltage qualification unit is configured to allow said repair logic to begin adjusting said feature activation voltages only after reads of a plurality of phase change memory reference cells are accurate.

11. The memory of claim 10, wherein said activation voltage variances correct for differences between designed feature activation voltages and as-manufactured feature activation voltages.

12. The memory of claim 9, wherein said reference cells comprise one or more pairs of reference cells configured to store complementary logic states.

13. The memory of claim 9, further comprising configuration logic which loads configuration information from a phase change memory into a volatile memory, said configuration information residing in said phase change memory when power to the memory is OFF, said configuration information at least partially determining one or more operation parameters of said memory, wherein said voltage qualification unit is configured to allow said configuration logic to begin loading configuration information only after reads of a plurality of phase change memory reference cells are accurate.

14. The memory of claim 13, wherein said operation parameters comprise one or more of internal supply voltages, sense amplifier timings, setup timings in data paths, hold timings in data paths, and an ON/OFF state of one or more memory functions.

* * * * *